United States Patent
Aoki et al.

(10) Patent No.: US 12,417,931 B2
(45) Date of Patent: Sep. 16, 2025

(54) SUBSTRATE PROCESSING APPARATUS AND SUBSTRATE PROCESSING METHOD

(71) Applicant: SCREEN Holdings Co., Ltd., Kyoto (JP)

(72) Inventors: Rikuta Aoki, Kyoto (JP); Daijo Mizukami, Kyoto (JP); Tomoaki Aihara, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 477 days.

(21) Appl. No.: 17/700,937

(22) Filed: Mar. 22, 2022

(65) Prior Publication Data
US 2022/0310416 A1    Sep. 29, 2022

(30) Foreign Application Priority Data
Mar. 23, 2021  (JP) .................................. 2021-049053

(51) Int. Cl.
*H01L 21/67* (2006.01)
*B08B 3/02* (2006.01)
(Continued)

(52) U.S. Cl.
CPC .......... *H01L 21/67051* (2013.01); *B08B 3/02* (2013.01); *B08B 3/14* (2013.01);
(Continued)

(58) Field of Classification Search
CPC ......... H01L 21/67051; H01L 21/02057; H01L 21/68764; H01L 21/67017;
(Continued)

(56) References Cited

U.S. PATENT DOCUMENTS

| | | |
|---|---|---|
| 8,978,670 B2 | 3/2015 | Minamida et al. |
| 9,214,331 B2 | 12/2015 | Miya et al. |

(Continued)

FOREIGN PATENT DOCUMENTS

| | | |
|---|---|---|
| CN | 103887209 A | 6/2014 |
| CN | 110211897 A | 9/2019 |

(Continued)

OTHER PUBLICATIONS

Notice of Allowance dated Feb. 23, 2024 issued for Taiwanese Patent Application No. 111102400.

*Primary Examiner* — Alexander Markoff
(74) *Attorney, Agent, or Firm* — OSTROLENK FABER LLP

(57) ABSTRACT

A substrate processing apparatus includes a processing liquid tank, a first circulation pipe, a filter, a pump, and a controller. The first circulation pipe has an upstream end connected to the processing liquid tank and a downstream end connected to the processing liquid tank. A processing liquid circulates in the first circulation pipe. The filter is deposed in the first circulation pipe and captures particles contained in the processing liquid. The pump is disposed in the first circulation pipe. The pump includes a rotor and feeds the processing liquid by rotating the rotor. In activation of the pump in a stopped state, the controller controls the pump so that the rotor rotates at a rotational acceleration of no greater than 400 rpm/sec.

5 Claims, 14 Drawing Sheets

(51) Int. Cl.
   *B08B 3/14*      (2006.01)
   *B08B 13/00*     (2006.01)
   *H01L 21/02*     (2006.01)
   *H01L 21/687*    (2006.01)

(52) U.S. Cl.
   CPC ........ *B08B 13/00* (2013.01); *H01L 21/02057* (2013.01); *H01L 21/68764* (2013.01); *B08B 2203/027* (2013.01)

(58) Field of Classification Search
   CPC ........... H01L 21/67028; H01L 21/6708; H01L 21/67178; H01L 21/67253; B08B 3/02; B08B 3/14; B08B 13/00; B08B 2203/027; B01D 35/00; B01D 35/02; F04D 1/00; F04D 15/00; F04D 29/22
   See application file for complete search history.

(56) References Cited

U.S. PATENT DOCUMENTS

| | | | |
|---|---|---|---|
| 11,691,172 | B2 | 7/2023 | Nobukuni et al. |
| 2007/0175387 | A1 | 8/2007 | Kimura .................. 118/429 |
| 2011/0079252 | A1 | 4/2011 | Minamida et al. .......... 134/94.1 |
| 2012/0175819 | A1 | 7/2012 | Miya et al. .................... 264/334 |
| 2014/0174475 | A1 | 6/2014 | Takayanagi et al. ........... 134/18 |
| 2017/0014873 | A1 | 1/2017 | Higuchi et al. |
| 2019/0203724 | A1 | 7/2019 | Kuronuma et al. |
| 2019/0267260 | A1 | 8/2019 | Iwao et al. |
| 2021/0001370 | A1* | 1/2021 | Nobukuni ................ B05C 3/02 |
| 2023/0234091 | A1 | 7/2023 | Nobukuni et al. |

FOREIGN PATENT DOCUMENTS

| | | |
|---|---|---|
| DE | 19833257 C1 | 9/1999 |
| JP | H11-009920 A | 1/1999 |
| JP | 2005-193174 A | 7/2005 |
| JP | 2007-201329 A | 8/2007 |
| JP | 2013-207076 A | 10/2013 |
| JP | 2017-112314 A | 6/2017 |
| JP | 2018-157042 A | 10/2018 |
| JP | 2019-041039 A | 3/2019 |
| KR | 10-2021-0003682 A | 1/2021 |
| TW | 201133683 A | 10/2011 |
| TW | 201230177 A | 7/2012 |
| TW | 201930723 A | 8/2019 |
| TW | 201934814 A | 9/2019 |
| TW | 202110545 A | 3/2021 |

\* cited by examiner

SUBSTRATE PROCESSING APPARATUS AND SUBSTRATE PROCESSING METHOD

INCORPORATION BY REFERENCE

The present application claims priority under 35 U.S.C. § 119 to Japanese Patent Application No. 2021-49053, filed on Mar. 23, 2021. The contents of this application are incorporated herein by reference in their entirety.

TECHNICAL FIELD

The present disclosure relates to a substrate processing apparatus and a substrate processing method.

BACKGROUND ART

A certain liquid processing apparatus includes a tank, a circulation line, a pump, a filter, a back pressure valve, and a controller. The tank stores a processing liquid therein. The circulation line returns the processing liquid sent from the tank to the tank. The pump forms a circulation flow of the processing liquid in the circulation line. The filter is disposed downstream of the pump in the circulation line. The back pressure valve is disposed downstream of the filter in the circulation line. The controller controls the pump and the back pressure valve. The controller controls discharge pressure of the pump so that the discharge pressure of the pump rises to a first pressure in a start of circulation of the processing liquid in the circulation line and increases to a second pressure larger than the first pressure after a specific time period elapses.

When circulation of the processing liquid is started under control of the discharge pressure of the pump to the first pressure, a differential pressure applied between the upstream site and the downstream site of the filter can be reduced to a small differential pressure. As a result, passing of foreign matter (particles) through the filter due to presence of discharge pressure of the pump directly after start of circulation of the processing liquid can be inhibited.

SUMMARY

According to an aspect of the present disclosure, a substrate processing apparatus processes a substrate with a processing liquid. The substrate processing apparatus includes a processing liquid storing section, a first circulation pipe, a filter, a pump, and a controller. The processing liquid storing section stores the processing liquid therein. The first circulation pipe has an upstream end connected to the processing liquid storing section and a downstream end connected to the processing liquid storing section. The processing liquid circulates in the first circulation pipe. The filter is disposed in the first circulation pipe and captures particles contained in the processing liquid. The pump is disposed in the first circulation pipe. The controller controls the pump. The pump includes a rotor and feeds the processing liquid by rotating the rotor. In activation of the pump in a stopped state, the controller controls the pump so that that the rotor rotates at a rotational acceleration of no greater than 400 rpm/sec.

In the aspect of the present disclosure, in activation of the pump in the stopped state, the controller preferably controls the pump so that the rotor rotates at a constant rotational acceleration of no greater than 400 rpm/sec. Once a rotational speed of the rotor reaches a target rotational speed, the controller preferably controls the pump so that the rotor keeps rotating at the target rotational speed.

In the aspect of the present disclosure, in activation of the pump in the stopped state, the controller preferably controls the pump so that that the rotor rotates at a rotational acceleration of no greater than 50 rpm/sec.

In the aspect of the present disclosure, preferably, the substrate processing apparatus further includes a first liquid discharge pipe and a first liquid discharge valve. Preferably, the first liquid discharge pipe is connected to the first circulation pipe and discharges the processing liquid from the first circulation pipe. Preferably, the first liquid discharge valve is disposed in the first liquid discharge pipe and opens and closes a flow path of the first liquid discharge pipe. In activation of the pump in the stopped state, the controller preferably controls the first liquid discharge valve to open the flow path of the first liquid discharge pipe.

In the aspect of the present disclosure, preferably, the substrate processing apparatus further includes a second liquid discharge pipe and a second liquid discharge valve. Preferably, the second liquid discharge pipe extends from the filter and discharges the processing liquid from the filter. Preferably, the second liquid discharge valve is disposed in the second liquid discharge pipe and opens and closes a flow path of the second liquid discharge pipe. In activation of the pump in the stopped state, the controller preferably controls the second liquid discharge valve to open the flow path of the second liquid discharge pipe.

In the aspect of the present disclosure, preferably, the substrate processing apparatus further includes a first circulation valve, a second circulation pipe, and a second circulation valve. Preferably, the first circulation valve is disposed in the first circulation pipe and opens and closes a flow path of the first circulation pipe. Preferably, the second circulation pipe extends from the first circulation pipe to the processing liquid storing section. Preferably, the second circulation valve is disposed in the second circulation pipe and opens and closes a flow path of the second circulation pipe. In activation of the pump in the stopped state, the controller preferably controls the first circulation valve to block the flow path of the first circulation pipe and controls the second circulation valve to open the flow path of the second circulation pipe.

According to another aspect of the present disclosure, a substrate is processed with a processing liquid in a substrate processing method. The substrate processing method includes: a first rotation step of rotating a rotor of a pump at a rotational acceleration of no greater than 400 rpm/sec. in activation of the pump in a stopped state, the pump being disposed upstream of a filter in a first circulation pipe in which the processing liquid circulates; and a processing liquid supply step of supplying the processing liquid fed by the rotor to the substrate after the first rotation step.

In the aspect of the present disclosure, preferably, the substrate processing method further includes a second rotation step. In the first rotation step, the rotor is preferably rotated at a constant rotational acceleration of no greater than 400 rpm/sec. in activation of the pump in the stopped state. In the second rotation step, the rotor is preferably kept rotating at a target rotational speed once a rotational speed of the rotor reaches the target rotational speed. In the processing liquid supply step, the processing liquid is preferably supplied to the substrate in a state in which the rotor is kept rotating at the target rotational speed.

In the aspect of the present disclosure, in the first rotation step, the rotor is preferably rotated at a rotational acceleration of no greater than 50 rpm/sec. in activation of the pump in the stopped state.

In the aspect of the present disclosure, preferably, the substrate processing method further includes a circulation pipe liquid discharge step of discharging, in activation of the pump in the stopped state, the processing liquid from the first circulation pipe via a first liquid discharge pipe extending from the first circulation pipe.

In the aspect of the present disclosure, preferably, the substrate processing method further includes a filter liquid discharge step of discharging, in activation of the pump in the stopped state, the processing liquid from the filter via a second liquid discharge pipe extending from the filter, the filter being disposed in the first circulation pipe.

In the aspect of the present disclosure, preferably, the substrate processing method further includes a circulation step of supplying the processing liquid to a second circulation pipe while blocking a flow path of the first circulation pipe in activation of the pump in the stopped state, the second circulation pipe being connected to the first circulation pipe. Preferably, the second circulation pipe extends from the first circulation pipe to a processing liquid storing section that stores the processing liquid therein. In the circulation step, the processing liquid preferably circulates in the second circulation pipe.

DESCRIPTION OF EMBODIMENTS

Figure 1:
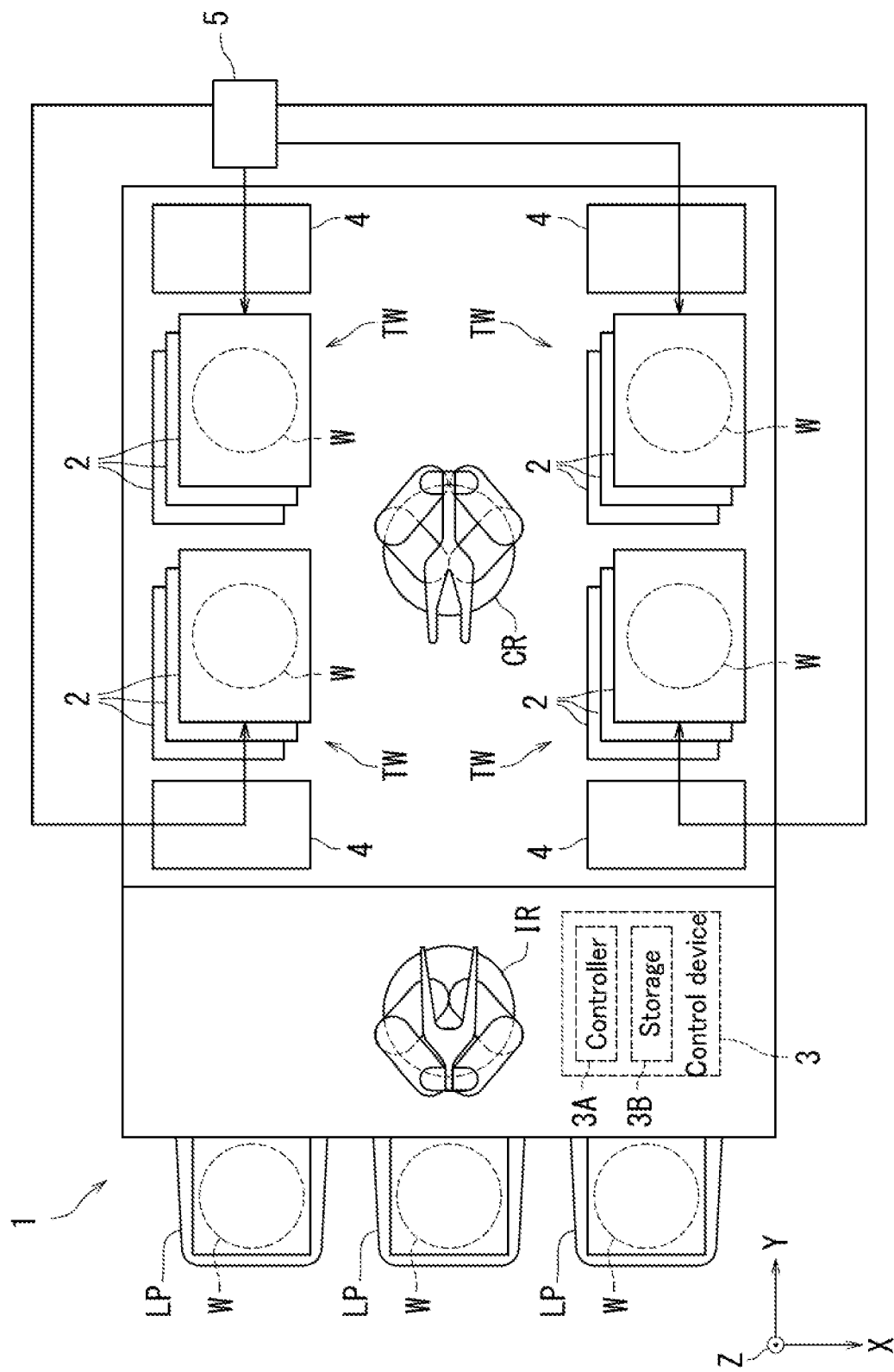
FIG. 1 is a plan view of the inside of a substrate processing apparatus according to an embodiment.

The following describes an embodiment of the present disclosure with reference to the accompanying drawings. Note that elements that are the same or equivalent are indicated by the same reference signs in the drawings and description thereof is not repeated. For convenience of explanation, three-dimensional Cartesian coordinate system (X, Y, Z) is drawn as appropriated in the drawings. In the drawings, an X axis and a Y axis are parallel to a horizontal direction and a Z axis is parallel to a vertical direction.

A substrate processing apparatus 1 will be described first with reference to FIG. 1. FIG. 1 is a plan view of the inside of the substrate processing apparatus 1. The substrate processing apparatus 1 illustrated in FIG. 1 processes substrates W with a processing liquid.

Examples of the substrate W include a semiconductor wafer, a substrate for liquid crystal display device use, a substrate for plasma display use, a substrate for field emission display (FED) use, a substrate for optical disk use, a substrate for magnetic disk use, a substrate for magnetic optical disk use, a substrate for photomask use, a ceramic substrate, and a substrate for solar cell use.

The processing liquid is a chemical liquid, for example. Examples of the chemical liquid include dilute hydrofluoric acid (DHF), hydrofluoric acid (HF), fluorine nitric acid (mixed liquid of hydrofluoric acid and nitric acid ($HNO_3$)), buffered hydrofluoric acid (BHF), fluorinated ammonium, hydrofluoric acid diluted by ethylene glycol (HFEG, mixed liquid of hydrofluoric acid and ethylene glycol), phosphoric acid ($H_3PO_4$), sulfuric acid, acetic acid, nitric acid, hydrochloric acid, ammonia water, hydrogen peroxide solution, organic acids (e.g., citric acid and oxalic acid), organic alkalis (e.g., tetramethylammonium hydroxide (TMAH)), sulfuric acid hydrogen peroxide mixture (SPM), mixed liquid of ammonium-hydroxide and hydrogen-peroxide (SC1), mixed liquid of hydrochloric acid and hydrogen peroxide (SC2), isopropyl alcohol (IPA), a surfactant, and a corrosion inhibitor.

The processing liquid may be a rinse liquid, for example. Examples of the rinse liquid include deionized water (DIW), carbonated water, electrolytic ionized water, hydrogen water, ozone water, and dilute hydrochloric acid water (e.g., approximately 10 ppm to 100 ppm).

In the following, the processing liquid is IPA as an example.

As illustrated in FIG. 1, the substrate processing apparatus 1 includes a plurality of loading ports LP, an indexer robot IR, a center robot CR, a plurality of processing units 2, a control device 3, a plurality of fluid boxes 4, and a processing liquid cabinet 5.

The loading ports LP each accommodate a plurality of substrates W in a stacked manner. The indexer robot IR transports each substrate W between the loading ports LP and the center robot CR. The center robot CR transports the substrate W between the indexer robot IR and the processing units 2. Each of the processing units 2 processes the substrate W by supplying the processing liquid to the substrate W. The fluid boxes 4 each accommodate a fluid machine. The processing liquid cabinet 5 accommodates the processing liquid.

Specifically, the processing units 2 form a plurality of towers TW (four towers TW in an example illustrated in FIG. 1) that are arranged so as to surround the center robot CR in a plan view. The towers TW each include a plurality of processing units 2 (three processing units 2 in an example illustrated in FIG. 1) that are stacked on one above the other. The fluid boxes 4 each correspond to one of the towers TW. The processing liquid in the processing liquid cabinet 5 is supplied, via any one of the fluid boxes 4, to all the processing units 2 included in the respective towers TW each corresponding to one of the fluid boxes 4.

The control device 3 controls the loading ports LP, the indexer robot IR, the center robot CR, the processing units 2, the fluid boxes 4, and the processing liquid cabinet 5. The control device 3 is a computer, for example.

The control device 3 includes a controller 3A and storage 3B. The controller 3A includes a processor such as a central processing unit (CPU). The storage 3B includes a storage device and stores data and computer programs therein. Specifically, the storage 3B includes a main storage device such as semiconductor memory, and an auxiliary storage device such as semiconductor memory, a solid state drive, and/or a hard disk drive. The storage 3B may include a removable medium. The storage 3B corresponds to an example of a non-transitory computer-readable recording medium.

The controller 3A executes the computer programs stored in the storage 3B to control the loading ports LP, the indexer robot IR, the center robot CR, the processing units 2, the fluid boxes 4, and the processing liquid cabinet 5.

Figure 2:
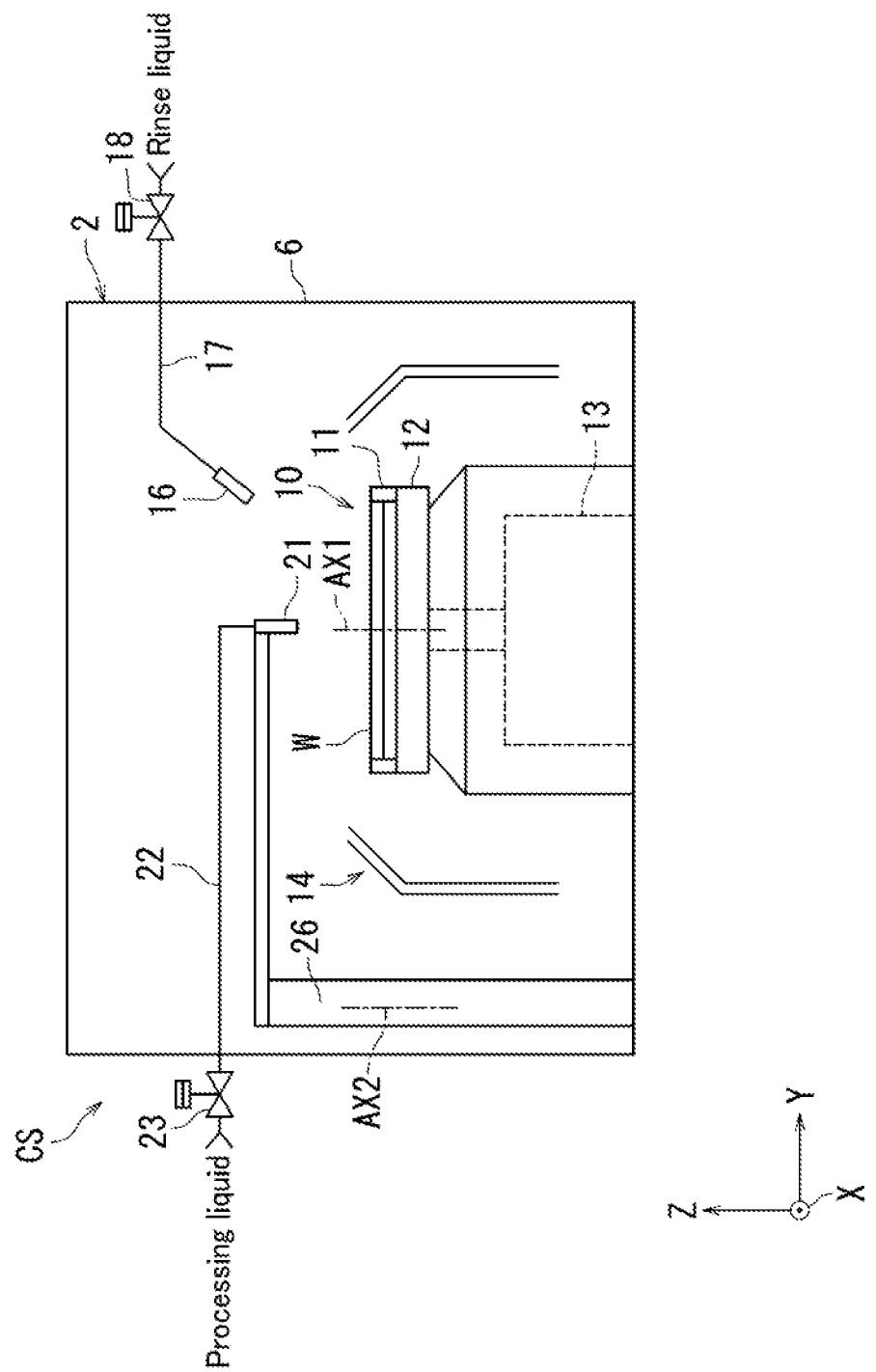
FIG. 2 is a side view of the inside of a processing unit in the embodiment.

The processing unit 2 will be described next with reference to FIG. 2. FIG. 2 is a side view of the inside of the processing units 2.

As illustrated in FIG. 2, the processing unit 2 includes a chamber 6, a spin chuck 10, a spin motor 13, a plurality of guards 14, a nozzle 16, a nozzle 21, and a nozzle moving section 26. The substrate processing apparatus 1 further includes a processing liquid supply apparatus CS, pipes 17, and valves 18. The processing liquid supply apparatus CS includes pipes 22 and valves 23. Note that the pipes 17 and the valves 18 may be included in the processing liquid supply apparatus CS.

The chamber 6 is substantially box-shaped. The chamber 6 accommodates the spin chuck 10, the spin motor 13, the guards 14, the nozzle 16, the nozzle 21, the nozzle moving section 26, a part of a pipe 17, and a part of a pipe 22. Note that the valves 18 and 23 may be accommodated in the chamber 6.

The spin chuck 10 holds the substrate W. Specifically, the spin motor 13 rotates the spin chuck 10 about a rotation axis AX1. Accordingly, the spin chuck 10 rotates the substrate W about the rotation axis AX1 while holding the substrate W horizontally. Specifically, the spin chuck 10 includes a plurality of chuck members 11 and a spin base 12. The spin base 12 is substantially disk-shaped and is in a horizontal posture to support the chuck members 11. The chuck members 11 holds the substrate W so that the substrate W is in a horizontal posture. Note that the spin chuck 10 may be a vacuum chuck or a Bernoulli chuck utilizing the Bernoulli effect, and is not limited specifically.

The nozzle 21 discharges the processing liquid toward the substrate W. The nozzle moving section 26 moves up and down the nozzle 21 and horizontally rotates the nozzle 21 about a rotational axis AX2. In order to move up and down the nozzle 21, the nozzle moving section 26 includes for example a ball screw mechanism and an electric motor that provides drive power to the ball screw mechanism. Furthermore, the nozzle moving section 26 includes for example an electric motor in order to horizontally rotate the nozzle 21.

The processing liquid supply apparatus CS supplies the processing liquid to the nozzle 21. Specifically, the pipe 22 of the processing liquid supply apparatus CS supplies the processing liquid to the nozzle 21. The processing liquid accordingly flows in the pipe 22. A valve 23 is disposed in the pipe 22. The valve 23 opens and closes the flow path of the pipe 22 to switch between supply and supply stop of the processing liquid to the nozzle 21.

The nozzle 16 supplies the rinse liquid toward the substrate W. As a result, the processing liquid is washed off from the substrate W.

The pipe 17 supplies the rinse liquid to the nozzle 16. The rinse liquid accordingly flows in the pipe 17. A valve 18 is disposed in the pipe 17. The valve 18 opens and closes the flow path of the pipe 17 to switch between supply and supply stop of the rinse liquid to the nozzle 16.

The guards 14 each have a substantially cylindrical shape. The guards 14 each receives the processing liquid or the rinse liquid drained from the substrate W.

Figure 3:
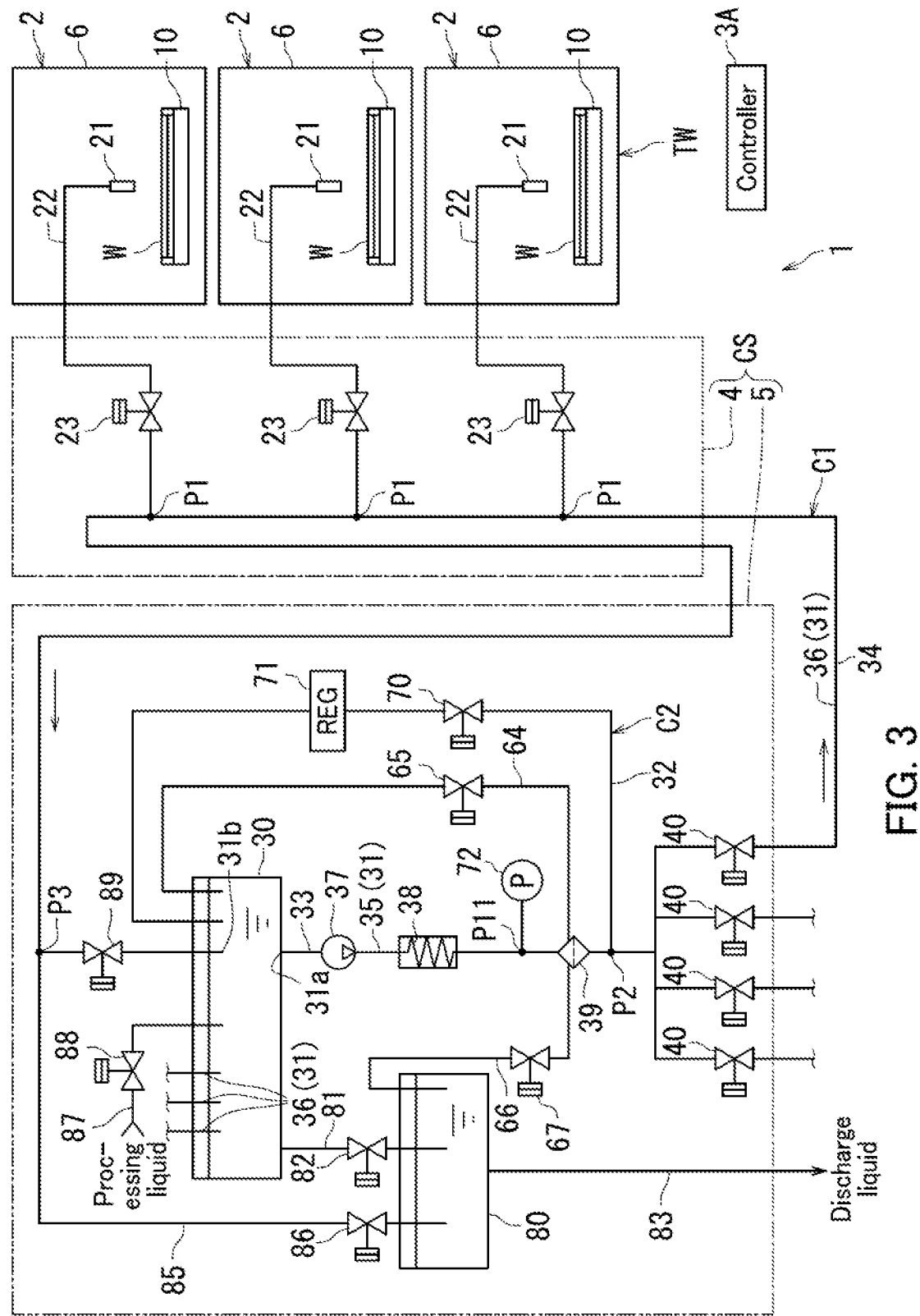
FIG. 3 is a diagram illustrating a configuration of a processing liquid supply apparatus in the embodiment.

Details of the processing liquid supply apparatus CS will be described next with reference to FIG. 3. FIG. 3 is a diagram illustrating the processing liquid supply apparatus CS. In FIG. 3, a fluid box 4 is indicated by a dashed and dotted line and the processing liquid cabinet 5 is indicated by a dashed and double dotted line. Members disposed in the area surrounded by the dashed and dotted line are disposed in the fluid box 4, and members disposed in the area surrounded by the dash and double dotted line are disposed in the processing liquid cabinet 5.

As illustrated in FIG. 3, the controller 3A executes the computer programs stored in the storage 3B to control the processing liquid supply apparatus CS. The processing liquid supply apparatus CS includes a processing liquid tank 30 that stores therein the processing liquid to be supplied to the substrate W and a circulation pipe that circulates the processing liquid in the processing liquid tank 30. The processing liquid tank 30 corresponds to an example of a "processing liquid storing section" in the present disclosure.

The circulation pipe includes a first circulation pipe 31 and a second circulation pipe 32. The first circulation pipe 31 has an upstream end 31a connected to the processing liquid tank 30 and a downstream end 31b connected to the processing liquid tank 30. The second circulation pipe 32 extends from the first circulation pipe 31 to the processing liquid tank 30. Specifically, the second circulation pipe 32 is connected to and branched from the first circulation pipe 31 and serves as a return pipe for returning the processing liquid in the first circulation pipe 31 to the processing liquid tank 30. The first circulation pipe 31 includes an upstream part 33 located upstream of a connection point P2 to which the second circulation pipe 32 is connected and a downstream part 34 located downstream of the connection point P2.

In an example illustrated in FIG. 3, the processing liquid tank 30 and the first circulation pipe 31 form a first circulation flow path C1 that circulates the processing liquid in the processing liquid tank 30. In the example illustrated in FIG. 3, the processing liquid tank 30, the upstream part 33, and the second circulation pipe 32 form a second circulation flow path C2 that circulates the processing liquid in the processing liquid tank 30.

Circulation of the processing liquid in the first circulation flow path C1 (first circulation pipe 31) may be referred to below as "outer circulation", and circulation of the processing liquid in the second circulation flow path C2 (second circulation pipe 32) may be referred to below as "inner circulation". As such, the first circulation flow path C1 is an outer circulation pathway and the second circulation flow path C2 is an inner circulation pathway. Furthermore, the first circulation pipe 31 is an outer circulation pipe and the second circulation pipe 32 is an inner circulation pipe.

Furthermore, the first circulation flow path C1 extends to the fluid box 4 in the example illustrated in FIG. 3. In other words, the first circulation flow path C1 supplies the processing liquid to the respective processing units 2. In a configuration in which the pipes 22 provided in one to one correspondence with the processing units 2 are each connected to and branched from the corresponding first circulation pipe 31, the processing liquid flowing in the first circulation flow path C1 is supplied to the processing units 2 via the pipes 22.

In addition, the first circulation pipe 31 in the example illustrated in FIG. 3 includes a common pipe 35 extending downstream from the processing liquid tank 30 and a plurality of individual pipes 36 branching from the common pipe 35. The common pipe 35 has an upstream end connected to the processing liquid tank 30. Each of the individual pipes 36 has a downstream end connected to the processing liquid tank 30. The upstream end of the common pipe 35 corresponds to the upstream end 31a of the first circulation pipe 31. The downstream end of each individual pipe 36 corresponds to the downstream end 31b of the first circulation pipe 31. The upstream part 33 is included in the common pipe 35. The connection point P2 is set to be located in the common pipe 35. The downstream part 34 includes the individual pipes 36 and a part of the common pipe 35.

The individual pipes 36 each correspond to one of the towers TW. FIG. 3 illustrates the entirety of one of the individual pipes 36 and a part of each of other three individual pipes 36. FIG. 3 illustrates three processing units 2 included in one of the towers TW. The three pipes 22 corresponding to the respective three processing units 2 included in the tower TW are connected to a single individual pipe 36. In other words, the pipes 22 are connected to and branched from the first circulation pipe 31 at connection points P1 set to be located downstream of the connection point P2.

In each of the individual pipes 36, a first circulation valve 40 for opening and closing the individual pipe 36 is disposed. During the first circulation valves 40 being closed, the processing liquid flowing in the common pipe 35 is not guided to each individual pipe 63. That is, the processing liquid flowing in the upstream part 33 is not guided to the downstream part 34. When the first circulation valves 40 are opened, the processing liquid flowing in the common pipe 35 is guided to each individual pipe 36. That is, the processing liquid flowing in the upstream part 33 is guided to the downstream part 34.

As illustrated in FIG. 3, the processing liquid supply apparatus CS of the substrate processing apparatus 1 includes a pump 37, a heater 38, and a filter 39. The pump 37 feeds the processing liquid in the processing liquid tank 30 to the first circulation pipe 31. The processing liquid tank 30 is heated by heater 38 so that the temperature of the processing liquid in the processing liquid tank 30 is adjusted. The filter 39 captures particles contained in the processing liquid flowing in the first circulation pipe 31. The pump 37, the heater 38, and the filter 39 are disposed in the upstream part 33 in the stated order from the side of the processing liquid tank 30. That is, the pump 37, the heater 38, and the filter 39 are disposed in the first circulation pipe 31 from upstream to downstream in the stated order.

The pump 37 in a driven state keeps feeding the processing liquid in the processing liquid tank 30 to the first circulation pipe 31 at a constant pressure. The pump 37 is disposed upstream of the filter 39 in the first circulation pipe 31 in which the processing liquid circulates. Details of the pump 37 will be described later with reference to FIG. 4A.

The heater 38 heats the processing liquid flowing in the upstream part 33. The heater 38 is a heater that generates Joule heat.

The filter 39 captures particles contained in the processing liquid passing through the filter 39. In other words, the filter 39 removes particles contained in the processing liquid passing through the filter 39. In still other words, the filter 39 filters the processing liquid.

For example, the filter 39 has multiple holes (not illustrated). The processing liquid passes through the holes of the filter 39. As a result, the processing liquid is filtered by the filter 39. In detail, particles contained in the processing liquid are adsorbed by walls, which define the holes, when passing through the holes of the filter 39 to be captured in the holes. As a result, the particles are removed from the processing liquid.

Particle capturing ability of the filter 39 varies with variation in pressure applied to the filter 39. The filter 39 under pressure application can capture smaller particles than that under no pressure application. The filter 39 can capture further small particles as the pressure applied to the filter 39 increases.

As illustrated in FIG. 3, the processing liquid supply apparatus CS of the substrate processing apparatus 1 further includes an air bleeding pipe 64 and a second liquid discharge pipe 66. The air bleeding pipe 64 bleeds air babbles (air) on the primary site in the filter 39. The second liquid discharge pipe 66 discharges liquid in the filter 39. The air bleeding pipe 64 is used for removing air bubbles in the filter 39 which serve as a cause of particle generation. Specifically, one end (upstream end) of each of the air bleeding pipe 64 and the second liquid discharge pipe 66 is connected to the primary site of the filter 39. The other end of the air bleeding pipe 64 is connected to the processing liquid tank 30. An air bleeding valve 65 for opening and closing the air bleeding pipe 64 is disposed in the air bleeding pipe 64. The other end of the second liquid discharge pipe 66 is connected to a waste liquid tank 80. The second liquid discharge pipe 66 extends from the filter 39 and discharges the processing liquid from the filter 39. A second liquid discharge valve 67 is disposed in the second liquid discharge pipe 66. The second liquid discharge valve 67 opens and closes the flow path of the second liquid discharge pipe 66.

As illustrated in FIG. 3, the processing liquid supply apparatus CS of the substrate processing apparatus 1 includes a second circulation valve 70 and a pressure adjusting unit. The second circulation valve 70 is disposed in the second circulation pipe 32. The pressure adjusting unit adjusts the pressure of the processing liquid flowing in the upstream part 33. The pressure adjusting unit is an opening adjusting unit that adjusts the opening of the second circulation pipe 32. The opening adjusting unit is disposed in the second circulation pipe 32. In the example illustrated in FIG. 3, the opening adjusting unit is a regulator 71. The regulator 71 is an electro-pneumatic regulator, for example.

The pressure adjusting unit includes a pressure sensor 72 that detects the pressure of the processing liquid in the upstream part 33. The pressure sensor 72 detects the pressure of the processing liquid within the upstream part 33 at a specific detection point P11 in the upstream part 33. Detection of the pressure of the processing liquid within the upstream part 33 using the pressure sensor 72 at the detection point P11 is substantially equivalent to detection of the pressure of the processing liquid flowing in the filter 39. The detection point P11 may be located upstream of the filter 39 as illustrated in FIG. 3 or located downstream of the filter 39.

As illustrated in FIG. 3, the processing liquid supply apparatus CS of the substrate processing apparatus 1 further includes a waste liquid tank 80 for storing the processing liquid discharged from the processing liquid tank 30. A discharge pipe 81 extending toward the waste liquid tank 80 is connected to the processing liquid tank 30. A discharge valve 82 that opens and closes the discharge pipe 81 is disposed in the middle of the discharge pipe 81. The discharge valve 82 is opened when the processing liquid stored in the processing liquid tank 30 is not used any more for processing the substrate W. As a result, the processing liquid stored in the processing liquid tank 30 is led to the waste liquid tank 80 from the processing liquid tank 30 to be stored in the waste liquid tank 80.

A liquid discharge pipe 83 is connected to the waste liquid tank 80. When a non-illustrated valve disposed in the liquid discharge pipe 83 is opened, the processing liquid stored in the waste liquid tank 80 is forwarded to a waste liquid processing instrument outside the apparatus and undergoes waste liquid processing in the waste liquid processing instrument.

One end of the first liquid discharge pipe 85 is connected to and branched from around the downstream site (e.g., around the downstream end of the first circulation pipe 31) of each individual pipe 36. That is, the first liquid discharge pipe 85 is connected to the first circulation pipe 31. The other end of the first liquid discharge pipe 85 is connected to the waste liquid tank 80. The first liquid discharge pipe 85 discharges the processing liquid from the first circulation pipe 31. A first liquid discharge valve 86 that opens and closes the flow path of the first liquid discharge pipe 85 is disposed in the middle of the first liquid discharge pipe 85. Furthermore, in each of the individual pipes 36, a return valve 89 for opening and closing the individual pipe 36 is disposed downstream of a connection point P3 connected to the first liquid discharge pipe 85.

The first liquid discharge valve 86 and the return valve 89 constitute a first switching unit that switches a guided destination of the processing liquid upstream of the connection point P3 in the downstream part 34 between the first liquid discharge pipe 85 and a part of the downstream part 34 located downstream of the connection point P3. A three-way valve may be employed instead of the combination of the first liquid discharge valve 86 and the return valve 89 as the first switching unit.

When the return valve 89 is opened with the first liquid discharge valve 86 closed, the processing liquid in the individual pipes 36 flowing upstream of the connection point P3 connected to the first liquid discharge pipe 85 is guided to the processing liquid tank 30 via the downstream site of the connection point P3. When the first liquid discharge valve 86 is opened with the return valve 89 closed by contrast, the processing liquid in the individual pipes 36 flowing upstream of the connection point P3 connected to the first liquid discharge pipe 85 is guided to the waste liquid tank 80 via the first liquid discharge pipe 85.

As illustrated in FIG. 3, the processing liquid supply apparatus CS of the substrate processing apparatus 1 further includes a processing liquid replenishment pipe 87 and a processing liquid replenishment valve 88. The processing liquid replenishment pipe 87 replenishes the processing liquid tank 30 with fresh liquid of the processing liquid. The processing liquid replenishment valve 88 opens and closes the processing liquid replenishment pipe 87.

The substrate processing apparatus 1 is in an idle state after power-up. Thereafter, when a readying operation is performed, the state of the substrate processing apparatus 1 transitions to a ready state. Once the substrate processing apparatus 1 is in the ready state, a substrate processing operation by the substrate processing apparatus 1 is set performable.

Operation states of the substrate processing apparatus 1 include a ready state (performable state, i.e., operating state) that is a working state in which processing is performable in the processing units 2, and an idle state (standby state) that is a working state in which processing is not performable (not ready) in the processing units 2. In the processing liquid supply apparatus CS, the ready state of the substrate processing apparatus 1 is a state in which supply of the processing liquid to the processing units 2 is enabled. In the processing liquid supply apparatus CS, the idle state of the substrate processing apparatus 1 is a working state in which supply of the processing liquid to the processing units 2 is not enabled (is not ready).

The idle state of the substrate processing apparatus 1 includes a circulation stop idle state (circulation stop standby state) and a circulation idle state (circulation standby state). In the circulation stop idle state, circulation of the processing liquid is stopped in both the first circulation flow path C1 and the second circulation flow path C2. In the circulation idle state, circulation of the processing liquid is maintained in the second circulation flow path C2 while circulation of the processing liquid is stopped in the first circulation flow path C1. That is, two types of idle states are prepared as the idle state of the substrate processing apparatus 1. In the following, the present embodiment focuses on only the ready state and the circulation stop idle state.

Figure 4A:
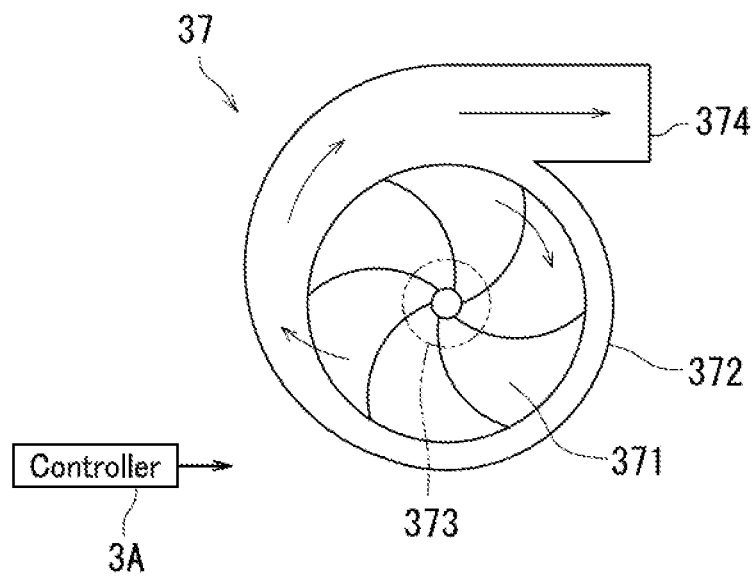
FIG. 4A is a plan view of a pump in the embodiment.

The pump 37 will be described next with reference to FIG. 4A. FIG. 4A is a plan view of the pump 37.

As illustrated in FIG. 4A, the controller 3A controls the pump 37. The pump 37 includes a rotor 371 and a housing 372. The housing 372 houses the rotor 371. The housing 372 has a suction port 373 and a discharge port 374. The rotor 371 rotates to suck the processing liquid from the suction port 373 and discharge the processing liquid from the discharge port 374. No particular limitations are placed on the rotor 371 as long as being capable of rotating, and the rotor 371 may be an impeller or a propeller, for example. The pump 37 in the example illustrated in FIG. 4A is a centrifugal pump. However, no particular limitations are placed on the type of the pump 37 as long as being capable of feeding the processing liquid by rotation of a rotor and the pump 37 may be a diagonal flow pump or an axial flow pump, for example. Furthermore, the rotor 371 may be supported by a bearing (not illustrated) in a rotatable manner or levitated in a non-contact state by magnetism. In a case in which the rotor 371 is levitated in a non-contact state by magnetism, the pump 37 is a magnetic levitation pump.

As has been described so far with reference to FIG. 4A, the pump 37 includes the rotor 371 and rotates the rotor 371 to feed the processing liquid. In the present embodiment, the controller 3A controls the pump 37 so that the rotor 371 rotates at a rotational acceleration of no greater than 400 rpm/sec. in activation of the pump 37 in the stopped state. This can inhibit generation of differential pressure in the pump 37 in the present embodiment. As such, generation of air bubbles in the processing liquid fed by the rotor 371 can be inhibited. As a result, particles accumulated on the secondary site of the filter 39, particles dispersed in the flow paths (the first circulation flow path C1 and/or the second circulation flow path C2) as a result of accumulation thereof on the secondary site of the filter 39, and particles stagnating in the flow paths (the first circulation flow path C1 and/or the second circulation flow path C2) can be inhibited from being supplied to the substrate W in a state of being captured in air bubbles in the processing liquid. That is, the processing liquid is effectively inhibited from being supplied to the substrate W with particles contained therein.

It has been proven in Examples described later that the number of particles in the processing liquid can be reduced by rotating the rotor 371 at a rotational acceleration of no greater than 400 rpm/sec. in activation of the pump 37 in the stopped state. The unit "rpm (rotations per minute)" refers to the number of rotations of the rotor 371 per unit time.

For example, when a pump in the stopped state is activated and rotates a rotor at a large rotational acceleration (e.g., 3000 rpm/sec.), differential pressure is generated inside the pump. Depending on a situation, this may generate air bubbles in the processing liquid being fed by the rotor.

Specifically, the pressure decreases as the velocity of a fluid increases according to Bernoulli's theorem. That is, the greater the acceleration of the fluid is, the greater the pressure drop is. Therefore, the pressure of the processing liquid readily reaches its saturated vapor pressure thereof. As such, when the pump in the stopped state is activated and the rotor is rotated at a large rotational acceleration, air bubbles may be easily generated in the processing liquid fed by the rotor.

Such air bubbles generated in the processing liquid may capture particles accumulated on the secondary site of a filter, particles dispersed in the flow paths as a result of accumulation thereof on the secondary site of the filter, and/or particles stagnating in the flow paths. In this case, the processing liquid containing such particles may be supplied to a substrate. Even in a case in which such a possibility is extremely unlikely, it is preferable to take measures in view of recent miniaturization of substrate patterns.

From the above, the controller 3A controls the pump 37 so that the rotor 371 rotates at a rotational acceleration of no greater than 400 rpm/sec. in activation of the pump 37 in the stopped state. Therefore, differential pressure can be inhibited from being generated inside the pump 37 in the present embodiment. As such, air bubbles can be inhibited from being generated in the processing liquid fed by the rotor 371. As a result, the processing liquid is effectively inhibited from being supplied to the substrate W with the particles contained therein.

Preferably, the controller 3A controls the pump 37 so that the rotor 371 rotates at a rotational acceleration of no greater than 50 rpm/sec. in activation of the pump 37 in the stopped state. Generation of differential pressure inside the pump 37 can be further inhibited in the above preferable example than in a case in which the rotational acceleration of the rotor 371 is no greater than 400 rpm/sec. and greater than 50 rpm/sec. As such, generation of air bubbles in the processing liquid fed by the rotor 371 can be further inhibited. Thus, particles accumulated on the secondary site of the filter 39, particles dispersed in flow paths (the first circulation flow path C1 and/or the second circulation flow path C2) as a result of accumulation thereof on the secondary site of the filter 39, and particles stagnating in the flow paths (the first circulation flow path C1 and/or the second circulation flow path C2) can be further inhibited from being supplied to the substrate W in a state of being captured in air bubbles in the processing liquid. That is, the processing liquid is further effectively inhibited from being supplied to the substrate W with such particles contained therein. The above has been also proven in Examples described later.

Here in the present specification, the term rotational acceleration refers to a "change rate of rotational speed of the rotor 371 per unit time". The term rotational speed refers to the "number of rotations of the rotor 371 per unit time" or "a physical quantity in proportion to the number of rotations of the rotor 371 per unit time". The physical quantity in proportion to the number of rotations of the rotor 371 per unit time is for example a rotation angle of the rotor 371 per unit time, that is, an angular velocity of the rotor 371.

A cause of particle generation, which is force majeure though, will be described next with reference to FIG. 3.

During stop of the pump 37, circulation of the processing liquid stops (e.g., a later-described circulation stop idle state). As such, no pressure is applied to the filter 39 due to no movement of the processing liquid in the filter 39. Therefore, in a state in which the pump 37 is stopped, the filter 39 captures less particles than that in a state in which the pump 37 is driven. As a result, in a state in which the pump 37 is stopped, particles captured by the filter 39 may flow into the secondary site through the filter 39 to be accumulated on the secondary site of the filter 39. When the pump 37 is activated to start circulation of the processing liquid in a state in which particles are accumulated on the secondary site of the filter 39, the particles accumulated on the secondary site of the filter 39 may disperse in the entire area of either or both the first circulation flow path C1 (first circulation pipe 31) and the second circulation flow path C2 (second circulation pipe 32).

Furthermore, in a state in which the pump 37 is stopped and circulation of the processing liquid stops (e.g., a later-described circulation stop idle state), chemical liquid (e.g., IPA) that is the processing liquid is not filtered by the filter 39 and stagnates in the first circulation flow path C1 (first circulation pipe 31), the second circulation flow path C2 (second circulation pipe 32), and/or the processing liquid tank 30. This may increase particles generated due to elution of pipes (resin pipes) and/or the processing liquid tank 30 by the chemical liquid (e.g., IPA) that is the processing liquid. The particles generated due to such elution may stagnate in the first circulation flow path C1 (first circulation pipe 31), the second circulation flow path C2 (second circulation pipe 32), and/or the processing liquid tank 30.

In view of the foregoing, in the present embodiment, the rotor 371 of the pump 37 is rotated at a rotational acceleration (preferably, a constant rotational acceleration) of no greater than 400 rpm/sec. in activation of the pump 37 in the stopped state, thereby inhibiting generation of air bubbles in activation of the pump 37 from the stopped state. As a result, particles generated due to the above cause (particles accumulated on the secondary site of the filter 39, particles dispersed in the flow paths as a result of accumulation thereof on the secondary site of the filter 39, and particles stagnating in the flow paths and the processing liquid tank 30) can be inhibited from being supplied to the substrate W in a state of being captured in air bubbles in the processing liquid.

Figure 4B:
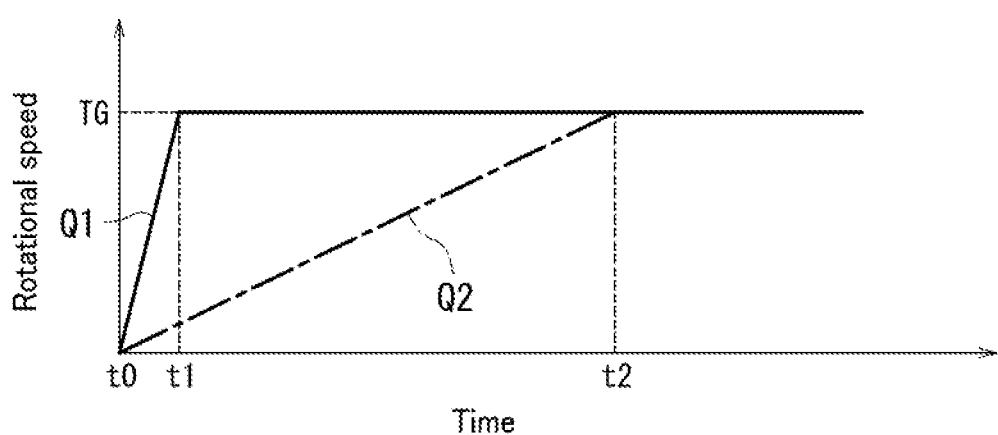
FIG. 4B is a graph representation showing rotational speed of the pump in the embodiment.

Control of the pump 37 will be described next with reference to FIG. 4B. FIG. 4B is a graph representation showing the rotational speed of the pump 37. In FIG. 4B, the horizontal axis indicates time and the vertical axis indicates the rotational speed.

As illustrated in FIG. 4A and as indcted by a straight line Q1 in FIG. 4B, the controller 3A controls the pump 37 so that the rotor 371 rotates at a constant rotational acceleration of no greater than 400 rpm/sec. in activation of the pump 37 in the stopped state. As such, generation of differential pressure inside the pump 37 can be further inhibited. Accordingly, generation of air bubbles in the processing liquid fed by the rotor 371 can be further inhibited. As a result, the processing liquid is further effectively inhibited from being supplied to the substrate W with air bubbles capturing particles contained therein.

Once the rotational speed of the rotor 371 reaches a target rotational speed TG the controller 3A controls the pump 37 so that the rotor 371 keeps rotating at the target rotational speed TG As a result, the pump 37 can feed the processing liquid at a constant pressure.

Specifically, the controller 3A causes the rotor 371 of the pump 37 to start rotating at time to. The controller 3A causes the rotor 371 to rotate at a constant rotational acceleration of no greater than 400 rpm/sec. during a period from the time t0 to time t1. Once the rotational speed reaches the target rotational speed TG at the time t1, the controller 3A causes the rotor 371 to keep rotating at the target rotational speed TG That is, the rotational acceleration of the rotor 371 is zero after the time t1.

For example, in a case in which the target rotational speed TG is 6000 rpm and the constant rotational acceleration of the rotor 371 is 400 rpm/sec., the rotational speed reaches the target rotational speed TG in 15 seconds from the time to.

Preferably, as illustrated in FIG. 4A and as indicted by a straight line Q2 in FIG. 4B, the controller 3A controls the pump 37 so that the rotor 371 rotates at a constant rotational acceleration of no greater than 50 rpm/sec. in activation of the pump 37 in the stopped state. In doing so, generation of differential pressure inside the pump 37 can be further inhibited than in a case in which the rotational acceleration of the rotor 371 is no greater than 400 rpm/sec. and greater than 50 rpm/sec. As such, generation of air bubbles in the processing liquid fed by the rotor 371 can be further inhibited. As a result, the processing liquid is further effectively inhibited from being supplied to the substrate W with air bubbles capturing particles contained therein.

Once the rotational speed of the rotor 371 reaches the target rotational speed TG the controller 3A controls the pump 37 so that the rotor 371 keeps rotating at the target rotational speed TG As a result, the pump 37 can feed the processing liquid at a constant pressure.

Specifically, the controller 3A causes the rotor 371 of the pump 37 to start rotating at the time t0. The controller 3A causes the rotor 371 to rotate at a constant rotational acceleration of no greater than 50 rpm/sec. during a period from the time t0 to time t2. Once the rotational speed reaches the target rotational speed TG at the time t2, the controller 3A causes the rotor 371 to keep rotating at the target rotational speed TG That is, the rotational acceleration of the rotor 371 is zero after the time t2.

For example, in a case in which the target rotational speed TG is 6000 rpm and the constant rotational acceleration of the rotor 371 is 50 rpm/sec., the rotational speed reaches the target rotational speed TG in 120 seconds from the time t0.

Figure 5:
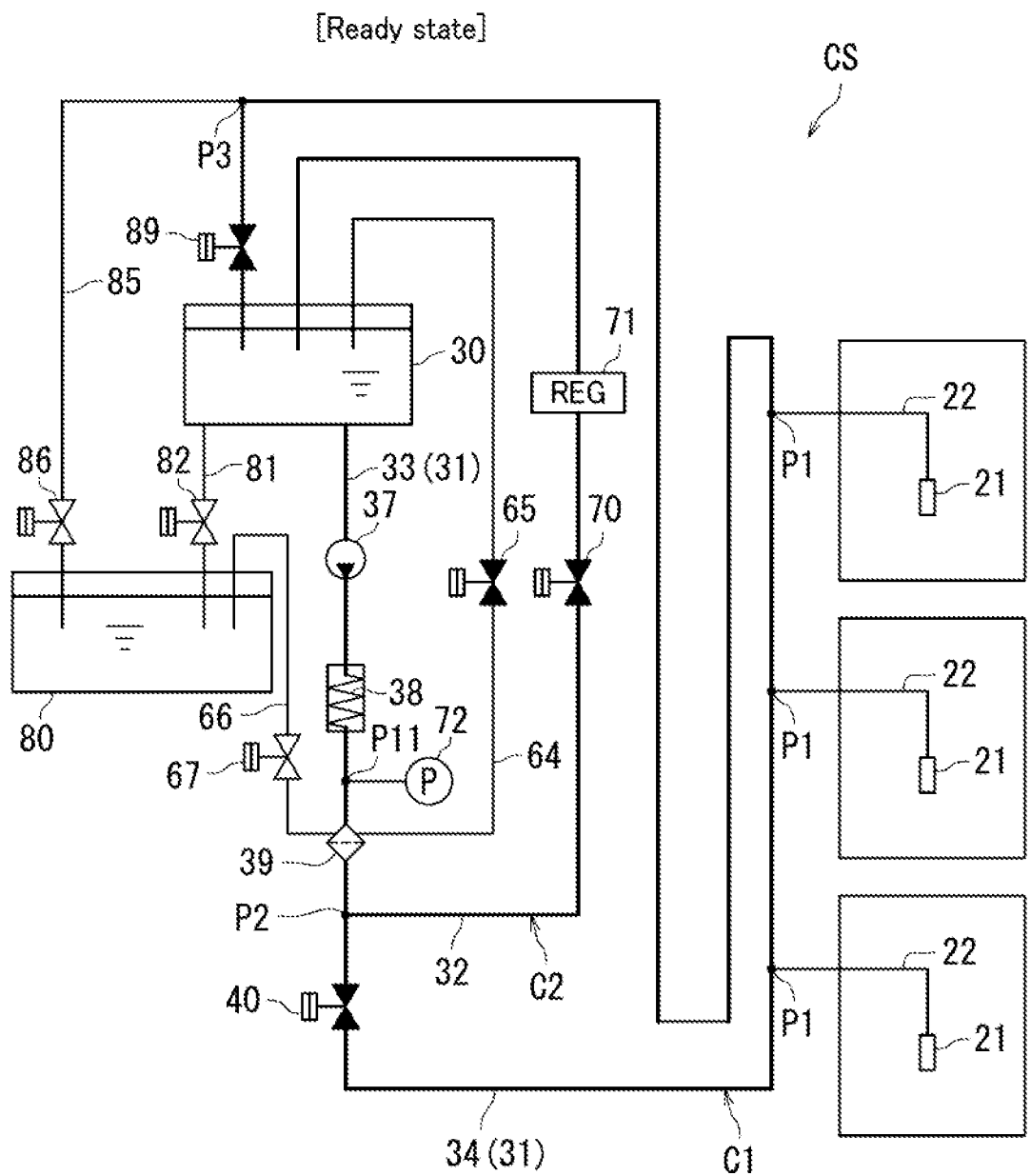
FIG. 5 is a diagram illustrating a flow of a processing liquid in a ready state of the processing liquid supply apparatus in the embodiment.
Figure 6:
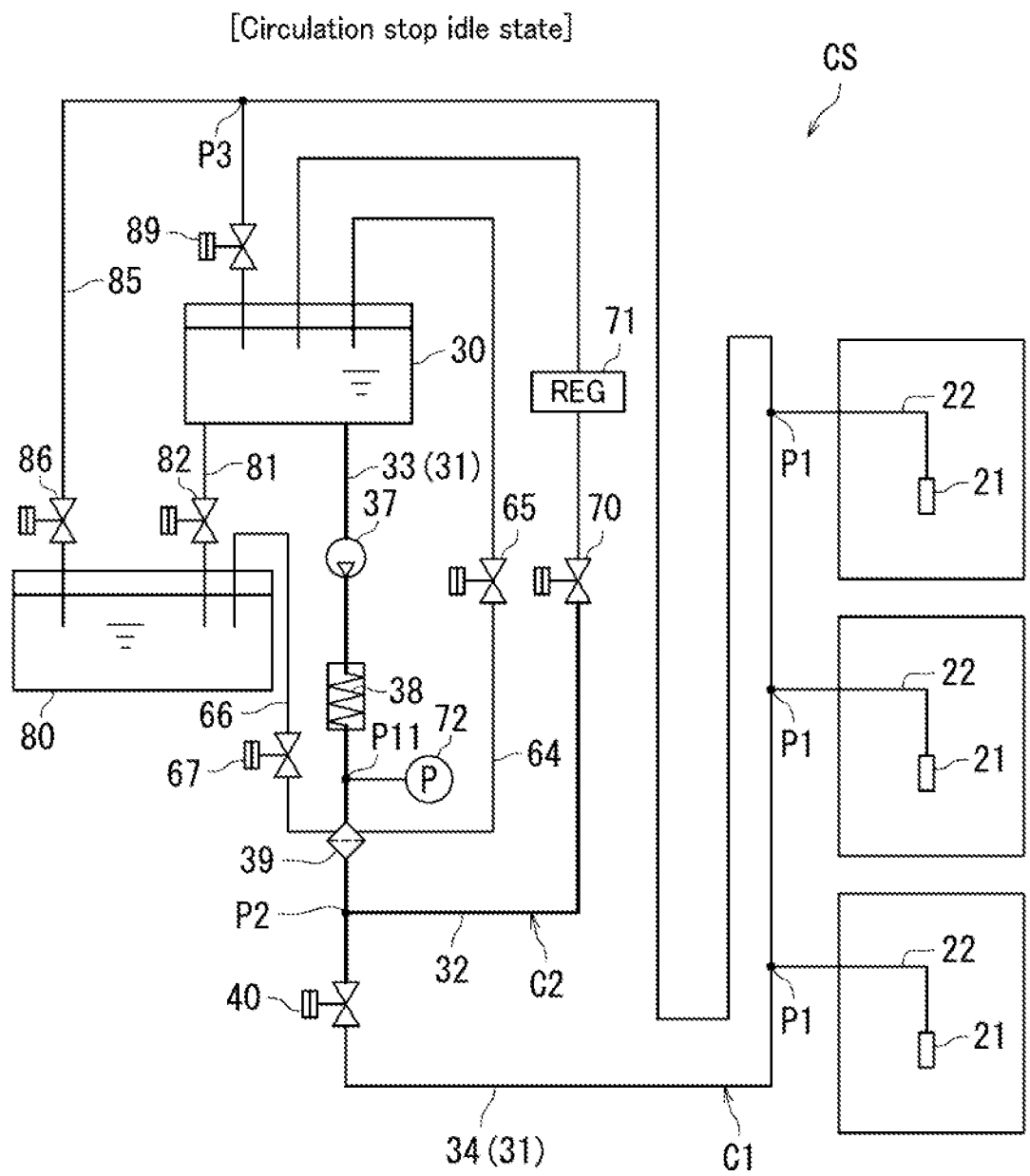
FIG. 6 is a diagram illustrating a flow of the processing liquid in a circulation stop idle state of the processing liquid supply apparatus in the embodiment.
Figure 7:
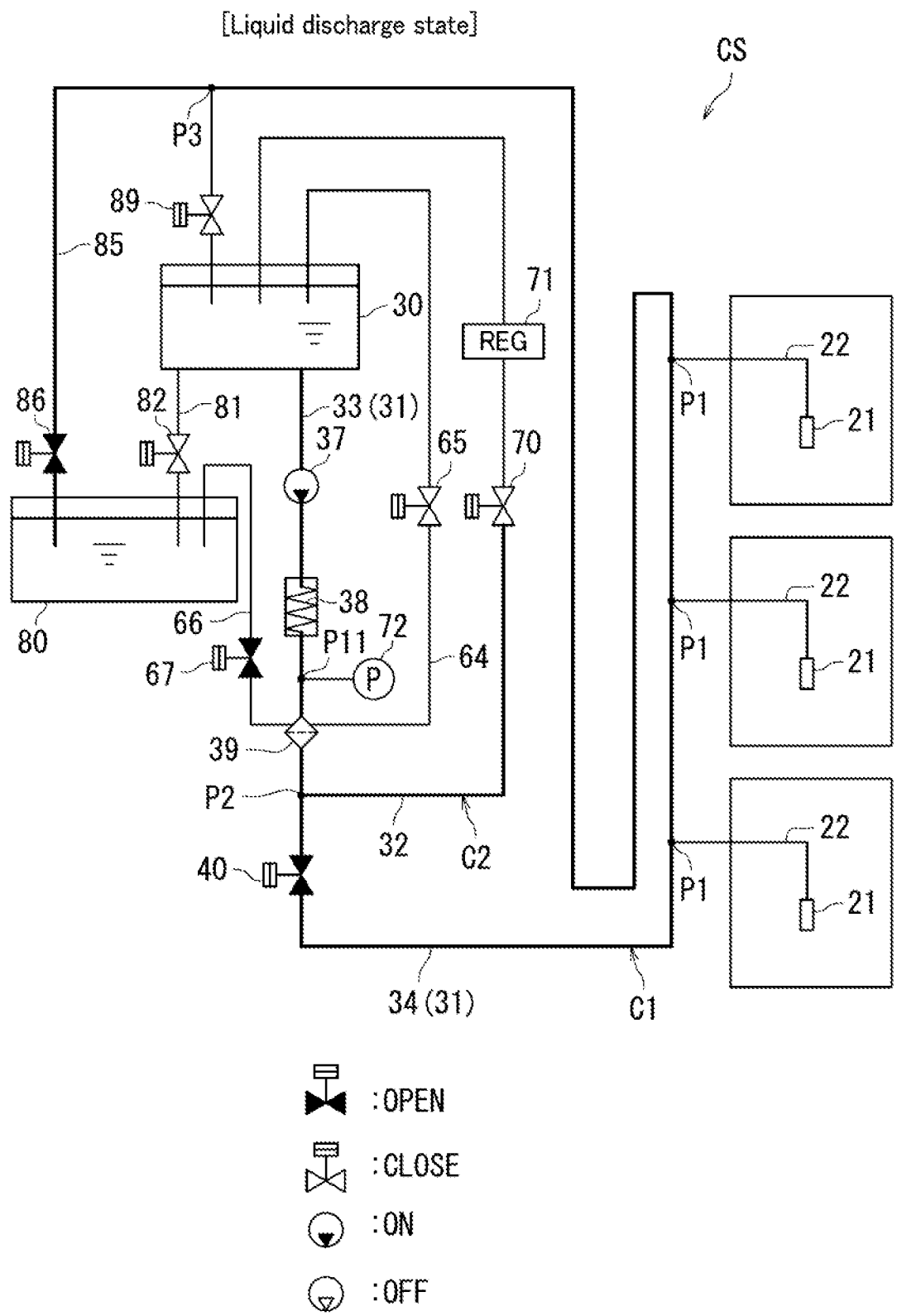
FIG. 7 is a diagram illustrating a flow of the processing liquid in a liquid discharge state of the processing liquid supply apparatus in the embodiment.

With reference to FIGS. 5 to 7, the ready state, the circulation stop idle state, and the liquid discharge state of the processing liquid supply apparatus CS will be described next. In this case, the white marks indicate valve closing while the black marks indicate valve opening for the valves 40, 65, 67, 70, 82, 86, and 89 in FIGS. 5 to 7. Furthermore, in the marks each indicating the pump 37, a white triangle indicates the pump 37 stopping and a black triangle indicates the pump 37 driving. In addition, the distribution channels of the processing liquid are indicated by thick lines.

The ready state will be described first with reference to FIG. 5. FIG. 5 is a diagram illustrating a flow of the processing liquid when the processing liquid supply apparatus CS is in the ready state.

As illustrated in FIG. 5, the pump 37 is in a driven state in the ready state. The first circulation valve 40 and the second circulation valve 70 are opened. The air bleeding valve 65 is opened and the second liquid discharge valve 67 is closed. The return valve 89 is opened and the first liquid discharge valve 86 is closed. The discharge valve 82 is also closed.

As such, the processing liquid in the processing liquid tank 30 is fed to the upstream part 33 of the first circulation pipe 31 by the pump 37 and flows from the upstream part 33 to the downstream part 34. The processing liquid in the upstream part 33 flows into the downstream part 34 via the connection point P2 and returns from the downstream part 34 to the processing liquid tank 30. In this time, particles contained in the processing liquid are captured by the filter 39. Furthermore, the processing liquid in the processing liquid tank 30 is heated by the heater 38 to a temperature prescribed in a recipe and sent to the downstream part 34. As a result, the processing liquid in the processing liquid tank 30 is sent to the downstream part 34 while being kept at a constant temperature higher than the ambient temperature (e.g., 20 to 26° C.) in the processing unit 2.

Furthermore, the processing liquid in the upstream part 33 is guided not only to the downstream part 34 but also to the second circulation pipe 32 via the connection point P2. The processing liquid guided to the second circulation pipe 32 is returned to the processing liquid tank 30 from the downstream end (connection point P2) of the upstream part 33.

That is, in the ready state (dual circulation state), the processing liquid circulates in the first circulation flow path C1 (first circulation pipe 31) and the processing liquid circulates in the second circulation flow path C2 (second circulation pipe 32).

The circulation stop idle state will be described next with reference to FIG. 6. FIG. 6 is a diagram illustrating a flow of the processing liquid when the processing liquid supply apparatus CS is in the circulation stop idle state.

As illustrated in FIG. 6, during the processing liquid supply apparatus CS being in the circulation stop idle state, the pump 37 is in the stopped state. The first circulation valve 40 and the second circulation valve 70 are closed. The other valves are also closed.

In the circulation stop idle state, circulation of the processing liquid is stopped in both the first circulation flow path C1 and the second circulation flow path C2 due to stop of the pump 37. In the circulation stop idle state, the processing liquid stagnates in the course of the first circulation flow path C1 and the second circulation flow path C2.

In one example of the present embodiment, the controller 3A controls the pump 37 so that the rotor 371 of the pump 37 rotates at a rotational acceleration (preferably, a constant rotational acceleration) of no greater than 400 rpm/sec. in transition from the circulation stop idle state illustrated in FIG. 6 to the ready state illustrated in FIG. 5. As a result, generation of air bubbles in the pump 37 can be inhibited with a result that the number of particles contained in the processing liquid supplied to the substrate W can be reduced effectively.

Preferably, in the present embodiment, the state of the processing liquid supply apparatus CS in the circulation stop idle state (FIG. 6) transitions to the ready state via a liquid discharge state when a system restart button (not illustrated) is operated.

FIG. 7 is a diagram illustrating a flow of the processing liquid when the processing liquid supply apparatus CS is in the liquid discharge state. As illustrated in FIG. 7, the processing liquid supply apparatus CS is in the liquid discharge state in a specific liquid discharge period T after release of the circulation stop idle state.

Specifically, the controller 3A activates the pump 37 in the stopped state and opens the first circulation valve 40. The controller 3A additionally opens the first liquid discharge valve 86 with the second circulation valve 70, the return valve 89, and the air bleeding valve 65 closed.

That is, in activation of the pump 37 in the stopped state, the controller 3A controls the first liquid discharge valve 86 to open the flow path of the first liquid discharge pipe 85. As such, during the specific liquid discharge period T, the processing liquid stagnating in the first circulation flow path C1 and the second circulation flow path C2 is discharged into the waste liquid tank 80 via the first liquid discharge pipe 85 without being returned to the processing liquid tank 30. Thus, particles accumulated on the secondary site of the filter 39, particles dispersed in the flow paths (the first circulation flow path C1 and/or the second circulation flow path C2) as a result of accumulation thereof on the secondary site of the filter 39, and particles stagnating in the flow paths (the first circulation flow path C1 and/or the second circulation flow path C2) can be discharged together with the processing liquid into the waste liquid tank 80. As a result, particles contained in the processing liquid supplied to the substrate W can be further reduced.

In addition, the controller 3A opens the second liquid discharge valve 67. That is, in activation of the pump 37 in the stopped state, the controller 3A controls the second liquid discharge valve 67 to open the flow path of the second liquid discharge pipe 66. Accordingly, the processing liquid present in the space on the primary site in the filter 39 is discharged to the waste liquid tank 80 via the second liquid discharge pipe 66 during the specific liquid discharge period T. Thus, particles in the processing liquid are also discharged into the waste liquid tank 80 from the second liquid discharge pipe 66. Consequently, particles contained in the processing liquid supplied to the substrate W can be further reduced.

Here, the specific liquid discharge period T is predetermined experimentally and/or empirically, for example. For example, the specific liquid discharge period T is preset based on supply capacity of the pump 37, viscosity of the processing liquid, pipe diameters, and pipe lengths so that all the processing liquid stagnating in the first circulation flow path C1 and the second circulation flow path C2 can be replaced with fresh processing liquid that is to be supplied after activation of the pump 37 is resumed.

When the specific liquid discharge period T elapses after the first liquid discharge valve 86 and the second liquid discharge valve 67 are opened, the controller 3A closes the first liquid discharge valve 86 and the second liquid discharge valve 67 and opens the return valve 89 and the second circulation valve 70. As a result, the state of the processing liquid supply apparatus CS transitions to the ready state illustrated in FIG. 5. In the ready state, processing of the substrate W is performed in the processing unit 2.

Figure 8:
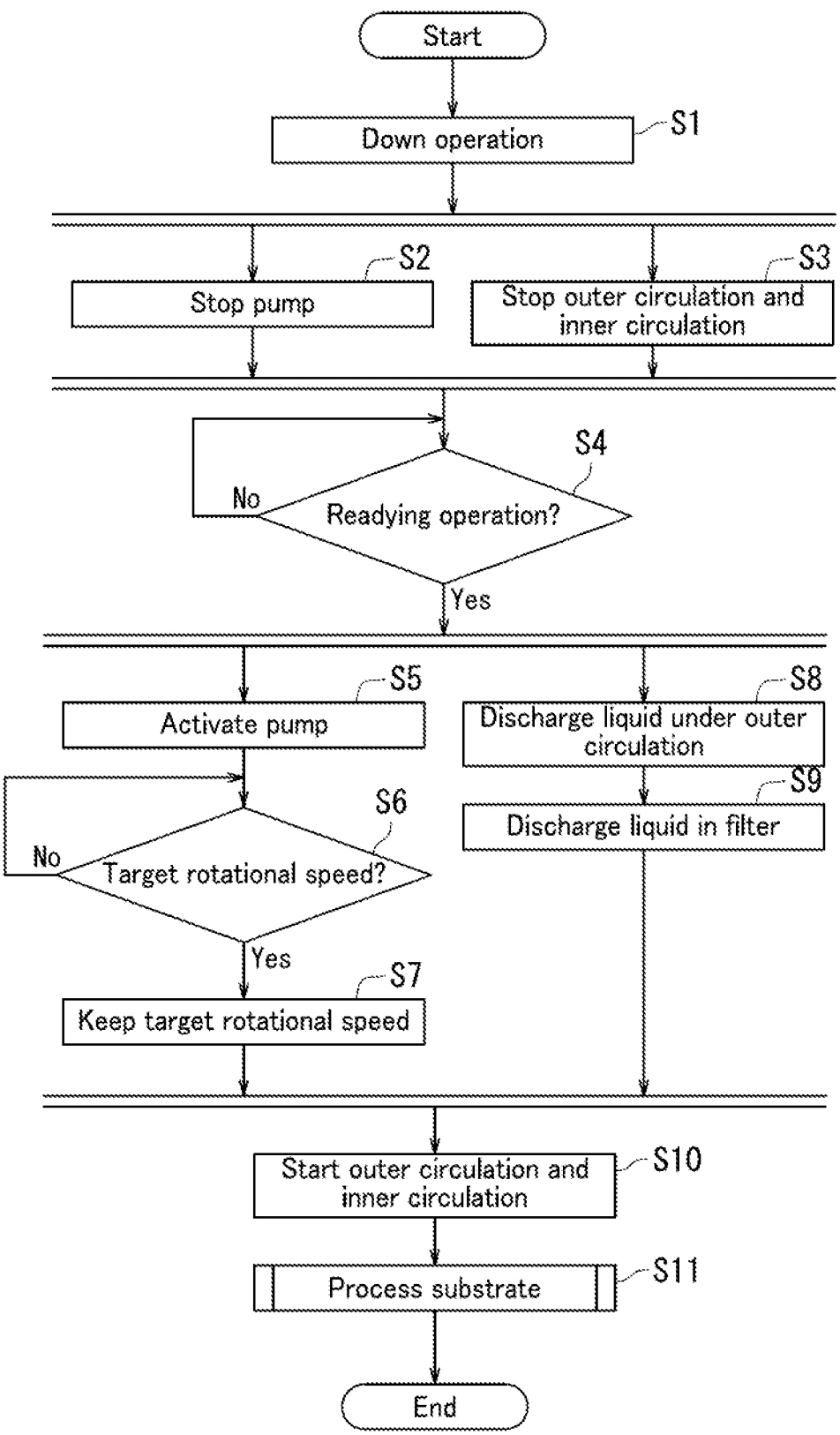
FIG. 8 is a flowchart depicting a substrate processing method according to the embodiment.

A substrate processing method according to the present embodiment will be described next with reference to FIGS. 3 and 8. In the substrate processing method, the substrate W is processed with the processing liquid. FIG. 8 is a flowchart depicting the substrate processing method according to the present embodiment. As depicted in FIG. 8, the substrate processing method in the present embodiment includes Steps S1 to S11. The substrate processing method is implemented by the substrate processing apparatus 1. At a start of the substrate processing method, the processing liquid supply apparatus CS is in the ready state (FIG. 5). That is, at a start of the substrate processing method, the pump 37 is driven and the processing liquid circulates in the first circulation flow path C1 and the second circulation flow path C2.

First in Step S1, the controller 3A receives an operation signal indicating a down operation from an operation device (not illustrate) as illustrated in FIGS. 3 and 8. The down operation refers to an operation to instruct transition from the ready state to the circulation stop idle state.

Next, Steps S2 and S3 are executed in parallel.

That is, the controller 3A stops the pump 37 (FIG. 6) in Step S2.

In Step S3 by contrast, the controller 3A controls the processing liquid supply apparatus CS so as to block the flow paths for outer circulation and inner circulation of the processing liquid (FIG. 6). Specifically, the controller 3A closes the first circulation valve 40 and the return valve 89. As a result, the flow path of the first circulation pipe 31 is blocked and the outer circulation of the processing liquid is stopped. In addition, the controller 3A closes the second circulation valve 70 and the air bleeding valve 65. As a result, the flow path of the second circulation pipe 32 is blocked and the inner circulation of the processing liquid is stopped.

When Steps S2 and S3 are executed, the state of the processing liquid supply apparatus CS transitions from the ready state (FIG. 5) to the circulation stop idle state (FIG. 6).

Next in Step S4, the controller 3A determines whether or not an operation signal indicating a readying operation has been received from the operation device (not illustrated). The readying operation refers to an operation to instruct transition from the circulation stop idle state to the ready state.

If it is determined that the operation signal indicating the readying operation has not been received (No) in Step S4, the routine remains in Step S4.

If it is determined that the operation signal indicating the readying operation has been received (Yes) in Step S4, the routine proceeds to Steps S5 and S8.

Next, Steps S5 to S7 and Steps S8 and S9 are executed in parallel.

That is, in Step S5, the controller 3A activates the pump 37 in the stopped state (FIG. 7). Specifically, in Step S5, the controller 3A causes the rotor 371 of the pump 37 to rotate at a rotational acceleration of no greater than 400 rpm/sec. in activation of the pump 37 in the stopped state. In activation of the pump 37 in the stopped state, the controller 3A causes the rotor 371 of the pump 37 to rotate at a constant rotational acceleration of no greater than 400 rpm/sec. in the present embodiment. Step S5 corresponds to an example of "first rotation step" in the present disclosure.

Next in Step S6, the controller 3A determines whether or not the rotational speed of the rotor 371 has reached the target rotational speed TG.

If it is determined that the rotational speed of the rotor 371 has not yet reached the target rotational speed TG (No) in Step S6, Step S6 is repeated until the rotational speed reaches the target rotational speed TG.

If it is determined that the rotational speed of the rotor 371 has reached the target rotational speed TG (Yes) in Step S6 by contrast, the routine proceeds to Step S7.

Next in Step S7, the controller 3A keeps the rotor 371 rotating at the target rotational speed TG Step S7 corresponds to an example of a "second rotation step" in the present disclosure.

In Step S8 by contrast, in activation of the pump 37 in the stopped state (Step S5), the controller 3A controls the processing liquid supply apparatus CS so that the processing liquid is discharged from the first circulation pipe 31 via the first liquid discharge pipe 85 extending from the first circulation pipe 31 in which the processing liquid is under outer circulation (FIG. 7). Specifically, the controller 3A opens the first circulation valve 40 and the first liquid discharge valve 86. As a result, the processing liquid is discharged to the waste liquid tank 80 via the first liquid discharge pipe 85 from the first circulation pipe 31. Step S8 corresponds to an example of a "circulation pipe liquid discharge step" in the present disclosure.

Next in Step S9, in activation of the pump 37 in the stopped state (Step S5), the controller 3A controls the processing liquid supply apparatus SC so that the processing liquid is discharged through the filter 39 disposed in the first circulation pipe 31 via the second liquid discharge pipe 66 extending from the filter 39 (FIG. 7). Specifically, the controller 3A opens the second liquid discharge valve 67. As a result, the processing liquid present in the space on the primary site of the filter 39 is discharged to the waste liquid tank 80 via the second liquid discharge pipe 66. Step S9 corresponds to an example of a "filter liquid discharge step" in the present disclosure.

When Steps S8 and S9 are executed, the state of the processing liquid supply apparatus CS transitions from the circulation stop idle state (FIG. 6) to the liquid discharge state (FIG. 7). The controller 3A maintains the liquid discharge state for the specific liquid discharge period T. When the specific liquid discharge period T elapses, the controller 3A advances the routine to Step S10.

Next in Step S10, the controller 3A controls the processing liquid supply apparatus CS so that the processing liquid starts undergoing the outer circulation and the inner circulation (FIG. 5). Specifically, the controller 3A closes the first liquid discharge valve 86 and opens the return valve 89. As a result, the flow path of the first circulation pipe 31 is opened and the outer circulation of the processing liquid is started. In addition, the controller 3A closes the second liquid discharge valve 67 and opens the second circulation valve 70 and the air bleeding valve 65. As a result, the flow path of the second circulation pipe 32 is opened and the inner circulation of the processing liquid is started.

When Step S10 is executed, the state of the processing liquid supply apparatus CS transitions from the liquid discharge state (FIG. 7) to the ready state (FIG. 5). The controller 3A keeps the rotor 371 of the pump 37 rotating at the target rotational speed TG (Step S7) even in the ready state.

Next in Step S11, the processing unit (FIG. 2) processes the substrate W with the processing liquid. That is, the processing unit 2 supplies the processing liquid fed by the rotor 371 of the pump 37 to the substrate W after Steps S5 to S10. Specifically, in Step S11, the processing unit 2 supplies the processing liquid to the substrate W in a state in which the rotor 371 of the pump 37 keeps rotating at the target rotational speed TG As a result, the substrate W is processed with the processing liquid. The substrate processing method ends then. Step S11 corresponds to an example of a "processing liquid supply step" in the present disclosure.

Figure 9:
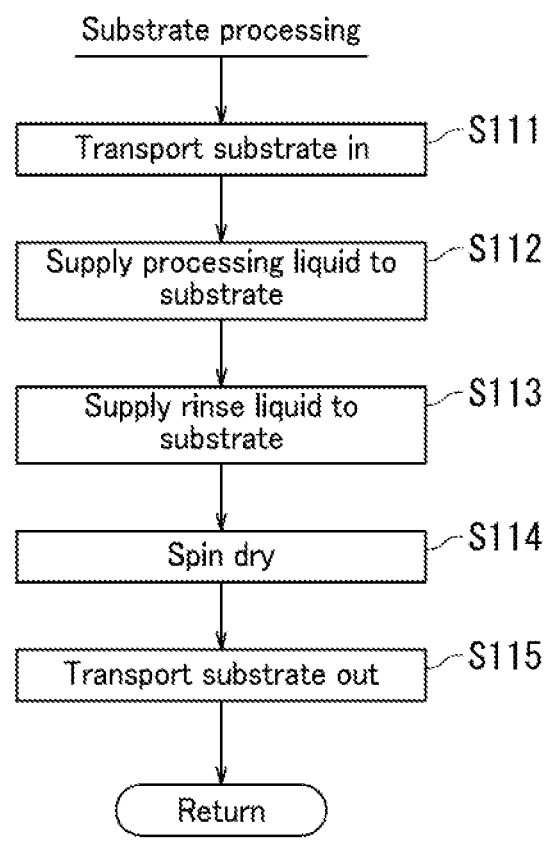
FIG. 9 is a flowchart depicting a flow of substrate processing in the embodiment.

FIG. 9 is a flowchart depicting Step S11 in FIG. 8. As depicted in FIG. 9, the substrate processing executed in Step S11 includes Steps S111 to S115.

First in Step S111, the center robot CR (FIG. 1) transports the substrate W into the processing unit 2. The spin chuck 10 in the processing unit 2 (FIG. 2) holds the substrate W. Furthermore, the spin motor 13 rotates the spin chuck 10 to rotate the substrate W.

Next in Step S112, the nozzle 21 of the processing unit 2 supplies the processing liquid to the rotating substrate W. Specifically, the controller 3A opens the valve 23. Accordingly, the processing liquid is supplied to the nozzle 21 via the pipe 22 from the first circulation pipe 31. As a result, the nozzle 21 supplies the processing liquid toward the substrate W. Step S112 corresponds to an example of a "processing liquid supply step" in the present disclosure.

When a specific processing period elapses after the valve 23 is opened, the valve 23 is closed to stop supply of the processing liquid from the nozzle 21. Note that the specific processing period is predetermined according to the purpose of processing the substrate W.

Next in Step S113, the nozzle 16 supplies the rinse liquid toward the rotating substrate W. As a result, the processing liquid on the substrate W is washed off with the rinse liquid.

Specifically, when the valve 18 is opened, the nozzle 16 supplies the rinse liquid toward the substrate W. When a specific rinsing period elapses after the valve 18 is opened, the valve 18 is closed to stop supply of the rinse liquid from the nozzle 16. Note that the specific rinsing period is predetermined experimentally and/or empirically, for example.

Next in Step S114, the processing unit 2 dries the substrate W by high-speed rotation of the substrate W.

Specifically, the spin motor 13 accelerates the substrate W in the rotational direction and rotates the substrate W at a higher rotational speed than the rotational speed of the substrate W in Steps S112 and S113. As a result, any liquids are removed from the substrate W and the substrate W is dried. When a specific drying period elapses from a start of high-speed rotation of the substrate W, the spin motor 13 stops rotating. Rotation of the substrate W is accordingly stopped. Note that the specific drying period is predetermined experimentally and/or empirically, for example.

Next in Step S115, the center robot CR transports the substrate W out of the processing unit 2. That is, the processed substrate W is transported out of the chamber 6. The routine returns to the main routine in FIG. 8 then, and the substrate processing method ends.

(Variation)

A substrate processing apparatus 1 according to a variation of the present disclosure will be described with reference to FIGS. 10 to 12. The substrate processing apparatus 1 according to the variation has the same hardware configuration as the substrate processing apparatus 1 described with reference to FIGS. 1 to 3. The variation mainly differs from the present embodiment described with reference to FIGS. 5 and 7 in that only the outer circulation is executed in the ready state and an inner circulation state is presented instead of the liquid discharge state. In the following, differences of the variation from the present embodiment will be mainly described.

Figure 10:
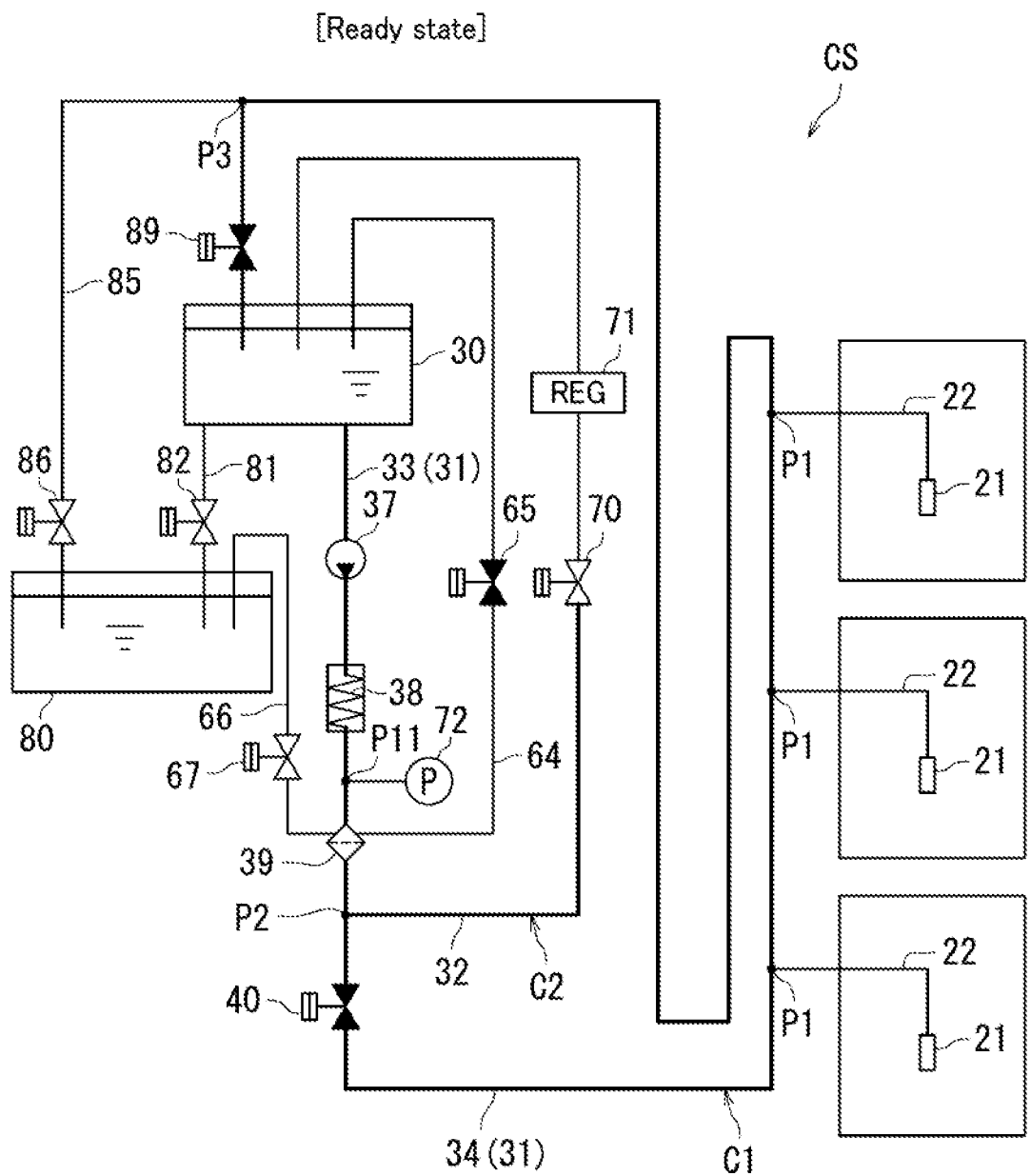
FIG. 10 is a diagram illustrating a ready state of a processing liquid supply apparatus according to a variation of the embodiment.

FIG. 10 is a diagram illustrating a ready state of the processing liquid supply apparatus CS in the variation. As illustrated in FIG. 10, the second circulation valve 70 is closed in the ready state. Accordingly, the processing liquid does not flow in the second circulation pipe 32. That is, the processing liquid does not undergo the inner circulation. The other conditions of the processing liquid supply apparatus CS are the same as those in the ready state illustrated in FIG. 5. Accordingly, the processing liquid flows in the first circulation pipe 31 (first circulation flow path C1) in the ready state. That is, the processing liquid undergoes only the outer circulation.

In the variation, upon receiving an instruction to transition from the circulation stop idle state illustrated in FIG. 6 to the ready state illustrated in FIG. 10, the controller 3A controls the processing liquid supply apparatus CS so that the state of the processing liquid supply apparatus CS is in the inner circulation state instead of immediate transition to the ready state.

Figure 11:
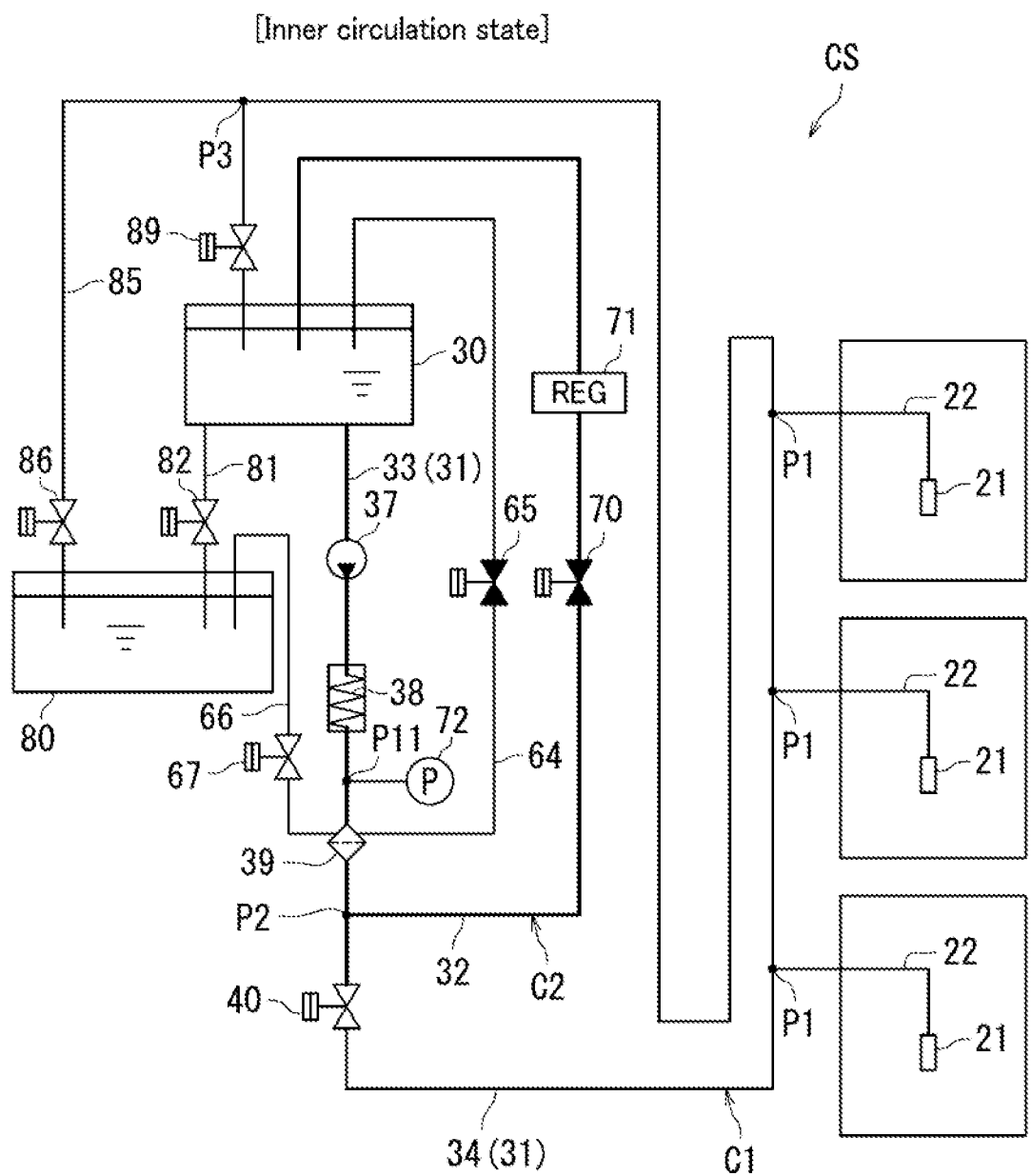
FIG. 11 is a diagram illustrating an inner circulation state of the processing liquid supply apparatus in the variation of the embodiment.

FIG. 11 is a diagram illustrating the inner circulation state of the processing liquid supply apparatus CS in the variation. As illustrated in FIG. 11, the second circulation valve 70 and the air bleeding valve 65 are opened with the first circulation valve 40 closed in the inner circulation state. As a result, the processing liquid flows in the second circulation pipe 32 (second circulation flow path C2). That is the processing liquid undergoes the inner circulation.

Specifically, in activation of the pump 37 in the stopped state, the controller 3A controls the first circulation valve 40 to block the flow path of the first circulation pipe 31 and controls the second circulation valve 70 to open the flow path of the second circulation pipe 32. As a result, the processing liquid does not undergo the outer circulation in the first circulation pipe 31 (first circulation flow path C1) and undergoes the inner circulation in the second circulation pipe 32 (second circulation flow path C2). The processing liquid undergoes the inner circulation until the temperature of the processing liquid reaches a target temperature. When the temperature of the processing liquid reaches the target temperature, for example, the state of the processing liquid supply apparatus CS transitions from the inner circulation state (FIG. 11) to the ready state (FIG. 10).

In the variation, the rotational speed of the rotor 371 of the pump 37 can be made to reach the target rotational speed TG in execution of the inner circulation. Furthermore, the temperature of the processing liquid can be quickly stabilized after transition to the ready state because the temperature of the processing liquid has reached the target temperature by the inner circulation.

For example, the inner circulation of the processing liquid in the inner circulation state is executed only in a specific circulation period. The specific circulation period is a period that is predetermined experimentally and/or empirically, for example, and that is a period until the temperature of the processing liquid reaches the target temperature. In this case, for example, the specific circulation period may be set to a period from the time when the rotational speed of the rotor 371 of the pump 37 is zero to the time when it reaches the target rotational speed TG In this case, the "period from the time when the rotational speed is zero to the time when it reaches the target rotational speed TG" is a period until the rotational speed reaches the target rotational speed TG in a situation in which the rotor 371 of the pump 37 in the stopped state is rotated at a rotational acceleration (preferably, a constant rotational acceleration) of no greater than 400 rpm.

Note that the controller 3A controls the heater 38 so that the temperature of the processing liquid under the inner circulation is kept at the target temperature while monitoring the temperature of the processing liquid detected by a temperature sensor (not illustrated). Although not illustrated in FIG. 11, the temperature sensor is deposed in the upstream part 33, for example.

A substrate processing method according to the variation will be described next with reference to FIGS. 3 and 12. FIG. 12 is a flowchart depicting the substrate processing method according to the variation. As depicted in FIG. 12, the substrate processing method of the variation includes Steps S21 to S31. The substrate processing method is implemented by the substrate processing apparatus 1. At a start of the substrate processing method, the processing liquid supply apparatus CS is in the ready state (FIG. 10). That is, at a start of the substrate processing method, the pump 37 is driven and the processing liquid circulates in the first circulation flow path C1.

Figure 12:
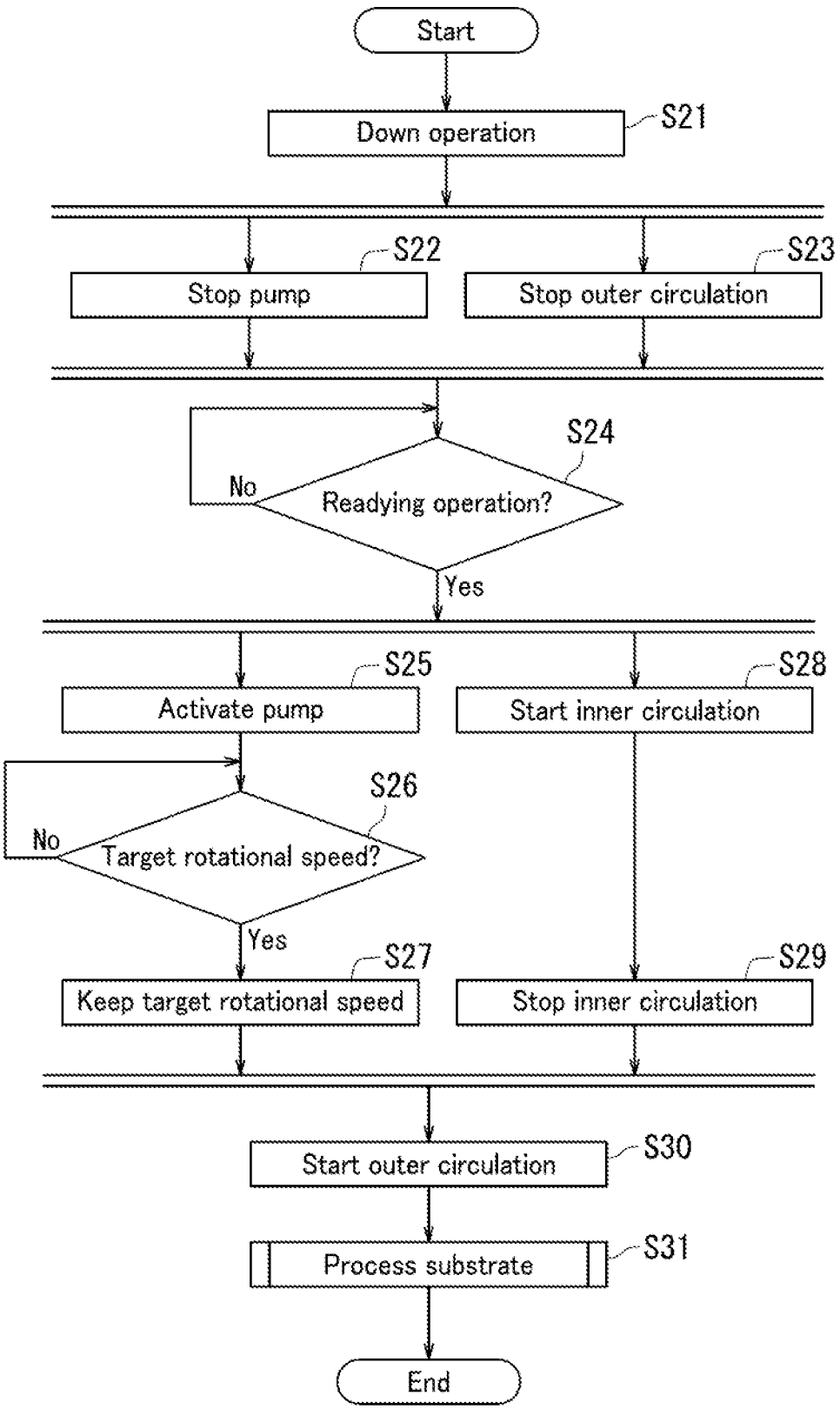
FIG. 12 is a flowchart depicting a flow of substrate processing according to the variation of the embodiment.

First in Step S21, the controller 3A receives the operation signal indicating the down operation from the operation device (not illustrate) as illustrated in FIGS. 3 and 12. The other conditions in Step S21 are the same as those in Step S1 in FIG. 8.

Next, Steps S22 and S23 are executed in parallel.

That is, the controller 3A stops the pump 37 (FIG. 6) in Step S22.

In Step S23 by contrast, the controller 3A controls the processing liquid supply apparatus CS to block the flow path of the outer circulation of the processing liquid (FIG. 6). Specifically, the controller 3A closes the first circulation valve 40 and the return valve 89. As a result, the flow path of the first circulation pipe 31 is blocked to stop the outer circulation of the processing liquid (FIG. 11). Note that the inner circulation is not executed in the ready state (FIG. 10) in the variation.

When Steps S22 and S23 are executed, the state of the processing liquid supply apparatus CS transitions from the ready state (FIG. 10) to the circulation stop idle state (FIG. 6).

Next in Step S24, the controller 3A determines whether or not the operation signal indicating the readying operation has been received from the operation device (not illustrated). The other conditions in Step S24 are the same as those in Step S4 in FIG. 8.

If it is determined that the operation signal indicating the readying operation has been received (Yes) in Step S24, the routine proceeds to Steps S25 and S28.

Next, Steps S25 to S27 and Steps S28 and S29 are executed in parallel.

That is, the controller 3A activates the pump 37 in the stopped state in Step S25. Specifically, in step S25, the controller 3A causes the rotor 371 of the pump 37 to rotate at a rotational acceleration (preferably, a constant rotational acceleration) of no greater than 400 rpm/sec. in activation of the pump 37 in the stopped state. The other conditions in Step S25 are the same as those in Step S5 in FIG. 8. Step S25 corresponds to an example of a "first rotation step" in the present disclosure.

Next in Step S26, the controller 3A determines whether or not the rotational speed of the rotor 371 has reached the target rotational speed TG The other conditions in Step S26 are the same as those in Step S6 in FIG. 8.

Next in Step S27, the controller 3A causes the rotor 371 to keep rotating at the target rotational speed TG The other conditions in Step S27 are the same as those in Step S7 in FIG. 6. Step S27 corresponds to an example of the "second rotation step" in the present disclosure.

In Step S28 by contrast, the controller 3A controls the processing liquid supply apparatus CS to start the inner circulation of the processing liquid (FIG. 11). That is, in activation of the pump 37 in the stopped state (Step S25), the controller 3A blocks the flow path of the first circulation pipe 31 and causes supply of the processing liquid to the second circulation pipe 32 connected to the first circulation pipe 31. Specifically, the controller 3A opens the second circulation valve 70 and the air bleeding valve 65 while keeping the first circulation valve 40 closed. As a result, the flow path of the second circulation pipe 32 is opened and the inner circulation of the processing liquid is started. That is, the processing liquid flows in the second circulation pipe 32 (second circulation flow path C2). Step S28 corresponds to an example of a "circulation step" in the present disclosure.

When Step S28 is executed, the state of the processing liquid supply apparatus CS transisions from the circulation stop idle state (FIG. 6) to the inner circulation state (FIG. 11).

Next in Step S29, the controller 3A controls the processing liquid supply apparatus CS to stop the inner circulation of the processing liquid when the specific circulation period elapses. Specifically, the controller 3A closes the second circulation valve 70 to block the second circulation pipe 32 (second circulation flow path C2). As a result, the inner circulation of the processing liquid is stopped. In this case, for example, the specific circulation period may be set to be equal to or longer than a period from the time when the rotational speed of the rotor 371 of the pump 37 is zero to the time when it reaches the target rotational speed TG.

Next in Step S30, the controller 3A controls the processing liquid supply apparatus CS to start the outer circulation of the processing liquid (FIG. 10). Specifically, the controller 3A opens the first circulation valve 40 and the return valve 89. As a result, the flow path of the first circulation pipe 31 is opened and the outer circulation of the processing liquid is started. That is, the processing liquid flows in the first circulation pipe 31 (first circulation flow path C1).

When Step S30 is executed, the state of the processing liquid supply apparatus CS transitions from the inner circulation state (FIG. 11) to the ready state (FIG. 10). The controller 3A keeps the rotor 371 of the pump 37 rotating at the target rotational speed TG (Step S27) even in the ready state.

Next in Step S31, the processing unit 2 (FIG. 2) processes the substrate W with the processing liquid. The other conditions in Step S31 are the same as those in Step S11 in FIG. 8. The substrate processing method ends then.

Details will be described next based on examples, but the present embodiment is not limited to the following examples.

EXAMPLES

Examples 1 to 3 and Comparative Example will be described with reference to FIGS. 13 to 15. The substrate processing apparatus 1 according to the present embodiment descried with reference to FIGS. 1 to 3 was used in Examples 1 to 3. A substrate processing apparatus used in Comparative Example had the same hardware configuration as the substrate processing apparatus 1 of the present embodiment described with reference to FIGS. 1 to 3. Note that each element of the substrate processing apparatus in Comparative Example will be described with the same reference sign assigned thereto as that of the corresponding element of the substrate processing apparatus 1 in Examples 1 to 3.

(1) The rotational acceleration of the rotor 371 of the pump 37 was as follows.
Example 1: 400 rpm/sec.
Example 2: 50 rpm/sec.
Example 3: 10 rpm/sec.
Comparative Example: 3000 rpm/sec.

(2) The target rotational speed TG in each of Examples 1 to 3 and Comparative Example was 6000 rpm.

Figure 13:
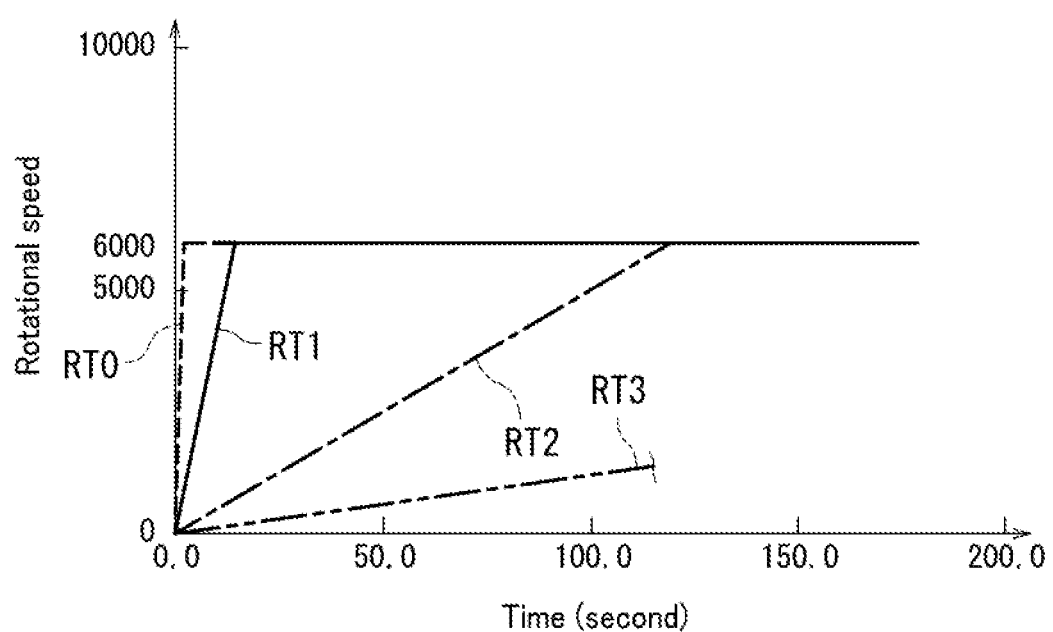
FIG. 13 is a graph representation showing rotational speed of the pump in each of Examples 1 to 3 and Comparative Example.

(3) FIG. 13 is a graph representation showing the rotational speed of the pump 37 in each of Examples 1 to 3 and Comparative Example. In FIG. 13, the horizontal axis indicates time (second) and the vertical axis indicates the rotational speed.

As indicated by a straight line RT1 in FIG. 13, the controller 3A controlled the pump 37 in Example 1 so that the rotor 371 rotated at a constant rotational acceleration of 400 rpm/sec. from the state in which the pump 37 was stopped. The rotational speed of the rotor 371 reached the target rotational speed TG in 15 seconds from the start and was kept at the target rotational speed TG.

As indicated by a straight line RT2, the controller 3A controlled the pump 37 in Example 2 so that the rotor 371 rotated at a constant rotational acceleration of 50 rpm/sec. from the state in which the pump 37 was stopped. The rotational speed of the rotor 371 reached the target rotational speed TG in 120 seconds from the start and was kept at the target rotational speed TG.

As indicated by a straight line RT3, the controller 3A controlled the pump 37 in Example 3 so that the rotor 371 rotated at a constant rotational acceleration of 10 rpm/sec. from the state in which the pump 37 was stopped. The rotational speed of the rotor 371 reached the target rotational speed TG in 600 seconds from the start and was kept at the target rotational speed TG Note that the graph of the rotational speed in Example 3 indicates only a part before the rotational speed reached the target rotational speed TG and the other part is not indicated due to space limitation.

As indicated by a straight line RT0, the controller 3A controlled the pump 37 in Comparative Example so that the rotor 371 rotated at a constant rotational acceleration of 3000 rpm/sec. from the state in which the pump 37 was stopped. The rotational speed of the rotor 371 reached the target rotational speed TG in 2 seconds from the start and was kept at the target rotational speed TG.

(4) Under the control, the state of the processing liquid supply apparatus CS transitioned from the circulation stop idle state (FIG. 6) in which the pump 37 was stopped directly to the ready state (FIG. 5) not via the liquid discharge state (FIG. 7). The ready state was maintained over 30 minutes from the time when the rotational speed of the rotor 371 of the pump 37 reached the target rotational speed TG In this case, after 30 minutes from the time when the rotational speed of the rotor 371 of the pump 37 reached 6000 rpm, the processing liquid was supplied to the nozzle 21 from the first circulation pipe 31 and the pipe 22 and supplied toward the substrate W from the nozzle 21. The processing liquid was supplied toward the substrate W for 8 seconds. The number of particles in the processing liquid on the surface of the substrate W was counted using a particle counter (SURFSCAN (registered Japanese trademark) SP7), product of KLA Tencor Corporation). In this case, the number of particles with a particle diameter of greater than 30 nm, the number of particles with a particle diameter of greater than 19 nm, and the number of particles with a particle diameter of greater than 15 nm were counted. The particle diameter was a length of the largest part of each particle.

Figure 14:
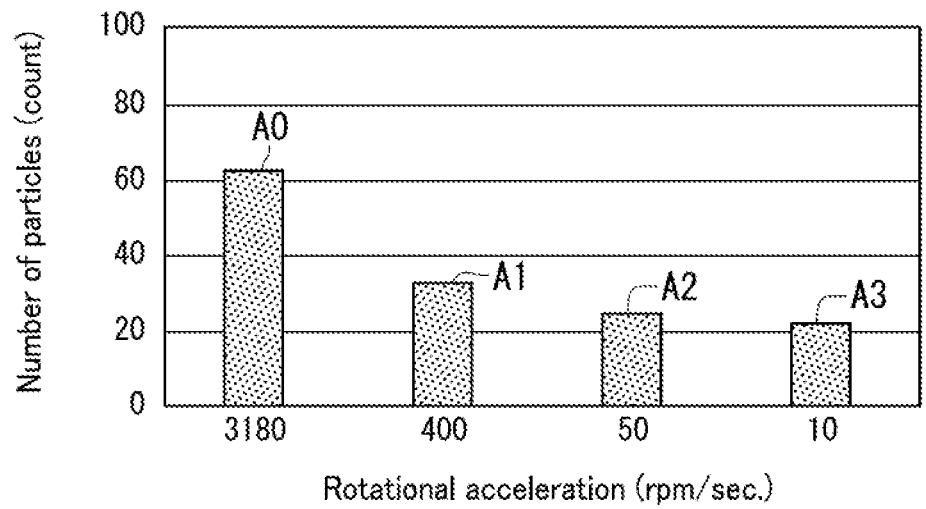
FIG. 14 is graph representation showing a relationship between rotational acceleration of the pump and the number of particles in each of Examples 1 to 3 and Comparative Example.

(5) FIG. 14 is a graph representation showing the relationship between the number of particles and the rotational acceleration of the pump 37 in each of Examples 1 to 3 and Comparative Example. In FIG. 14, the horizontal axis indicates the rotational acceleration (rpm/sec.) and the vertical axis indicates the number of particles with a particle diameter of greater than 30 nm. Furthermore, a bar A0 indicates the number of particles in Comparative Example, a bar A1 indicates the number of particles in Example 1, a bar A2 indicates the number of particles in Example 2, and a bar A3 indicates the number of particles in Example 3.

As shown in FIG. 14, the number of particles was 63 in Comparative Example (bar A0). By contrast, the number of particles was 33 in Example 1 (bar A1), the number of particles was 25 in Example 2 (bar A2), and the number of particles was 23 in Example 3 (bar A3).

As is clear from Examples 1 to 3, as a result of the rotational acceleration of the pump 37 at startup being set to no greater than 400 rpm/sec., the number of particles in the processing liquid supplied to the substrate W was approximately ½ or smaller than that in Comparative Example. That is, as a result of the rotational acceleration of the pump 37 at startup being set to no greater than 400 rpm/sec., the number of particles in the processing liquid supplied to the substrate W was reduced.

Furthermore, the number of particles in each of Example 2 (bar A2) and Example 3 (bar A3) was smaller than that in Example 1 (bar A1). That is, as a result of the rotational acceleration of the pump 37 at startup being set to no greater than 50 rpm/sec., the number of particles in the processing liquid supplied to the substrate W was further reduced.

Figure 15:
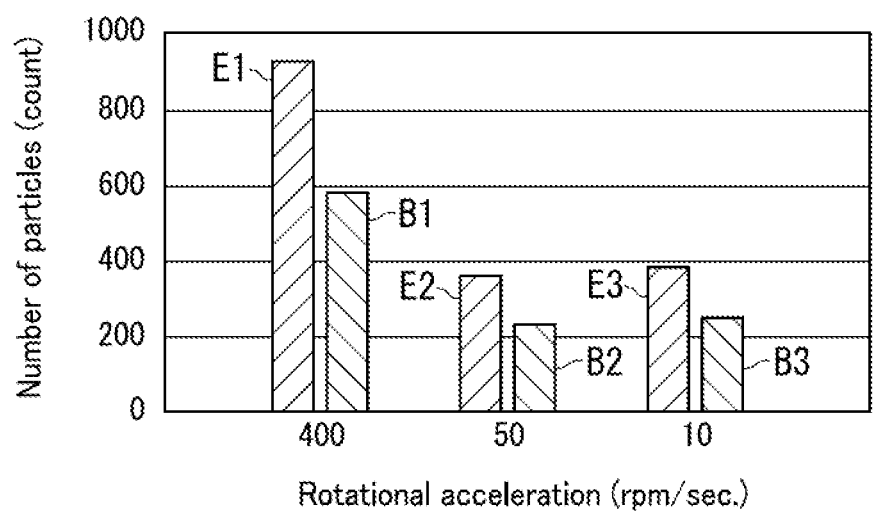
FIG. 15 is another graph representation showing a relationship between rotational acceleration of the pump and the number of particles in each of Examples 1 to 3.

(6) FIG. 15 is another graph representation showing the relationship between the number of particles and the rotational acceleration of the pump 37 in Examples 1 to 3. In FIG. 15, the horizontal axis indicates the rotational acceleration (rpm/sec.) and the vertical axis indicates the number of particles.

(6-1) In FIG. 15, a bar B1 indicates the number of particles with a particle diameter of greater than 19 nm in Example 1. A bar B2 indicates the number of particles with a particle diameter of greater than 19 nm in Example 2. A bar B3 indicates the number of particles with a particle diameter of greater than 19 nm in Example 3.

The number of particles was 583 in Example 1 (bar B1), the number of particles was 240 in Example 2 (bar B2), and the number of particles (bar B3) was 255 in Example 3.

The number of particles in each of Example 2 (Bar B2) and Example 3 (bar B3) was approximately ½ or smaller than that in Example 1 (bar B1). That is, as a result of the rotational acceleration of the pump 37 at startup being set to no greater than 50 rpm/sec., the number of particles in the processing liquid supplied to the substrate W was further reduced.

(6-2) In FIG. 15, a bar E1 indicates the number of particles with a particle diameter of greater than 15 nm in Example 1. A bar E2 indicates the number of particles with a particle diameter of greater than 15 nm in Example 2. A bar E3 indicates the number of particles with a particle diameter of greater than 15 nm in Example 3.

The number of particles was 927 in Example 1 (bar E1), the number of particles was 365 in Example 2 (bar E2), and the number of particles (bar E3) was 386 in Example 3.

The number of particles in each of Example 2 (Bar E2) and Example 3 (bar E3) was approximately 1/2.5 or smaller than that in Example 1 (bar E1). That is, as a result of the rotational acceleration of the pump 37 at startup being set to no greater than 50 rpm/sec., the number of particles in the processing liquid supplied to the substrate W was further reduced.

The present embodiment has been described so far with reference to the drawings. However, the present embodiment is not limited to the above examples and can be practiced in various manners within a scope not departing from the gist thereof. Also, any of the elements of configuration disclosed in the above embodiment can be varied as appropriate. For example, some of all the elements of configuration indicated in an embodiment may be added to elements of configuration in another embodiment. Alternatively or additionally, some of all the elements of configuration indicated in an embodiment can be omitted from the embodiment.

The drawings schematically illustrate elements of configuration in order to facilitate understanding. Aspects of the elements of configuration illustrated in the drawings, such as thickness, length, quantity, and intervals may differ from reality in order to aid preparation of the drawings. Furthermore, the configuration of each element of configuration indicated in the above embodiment are merely examples and are not intended as specific limitations. Various alterations may be made so long as there is no substantial deviation from the effects of the present embodiment.

(1) The circulation stop idle state has been described as a state in which the pump 37 is stopped in FIGS. 8 and 12. However, the state in which the pump 37 is stopped is not limited to the circulation stop idle state as long as the pump 37 in the stopped state is activated in the present embodiment. For example, the present embodiment is also applicable to a situation in which the pump 37 in the stopped state is activated for the first time directly after installation of the substrate processing apparatus 1 in a factory.

(2) In FIG. 8, Steps S8 and S9 may not be executed or either one of Steps S8 and S9 may be executed. Alternatively, Step S8 may be executed after Step S9. Furthermore, Steps S5 to S7 may be executed after Steps S8 and S9. In addition, Step S3 may be executed after Step S2 or Step S2 may be executed after Step S3.

(3) In FIG. 12, Steps S28 and S29 may not be executed. Alternatively, Steps S25 to S27 may be executed after Steps S28 and S29. Furthermore, Step S23 may be executed after Step S22 or Step S22 may be executed after Step 23.

What is claimed is:

1. A substrate processing method for processing a substrate with a processing liquid, the method comprising:
    a first rotation step of activating a pump that is in a stopped state and is disposed in a first circulation pipe such that a rotational speed of a rotor of the pump increases to a target rotational speed at a rotational acceleration of no greater than 50 rpm/second and that the rotational speed reaches the target rotational speed 120 seconds or longer after the activation of the pump, thereby to cause the processing liquid to flow through the first circulation pipe, the pump being disposed upstream of a filter in the first circulation pipe;
    a first circulation step of causing the processing liquid to circulate through the first circulation pipe after the first rotation step; and
    a processing liquid supply step of supplying the processing liquid to the substrate through a pipe branched from the first circulation pipe during the first circulation step.

2. The substrate processing method according to claim 1, further comprising
    a second rotation step, in which the rotor is kept rotating at the target rotational speed once the rotational speed of the rotor reaches the target rotational speed by the first rotation step, wherein, in the processing liquid supply step, the processing liquid is supplied to the substrate in a state in which the rotor is kept rotating at the target rotational speed.

3. The substrate processing method according to claim 1, further comprising
a circulation pipe liquid discharge step of discharging, during the first rotation step, the processing liquid from the first circulation pipe via a first liquid discharge pipe branched from the first circulation pipe.

4. The substrate processing apparatus according to claim 1, further comprising
a filter liquid discharge step of discharging, during the first rotation step, the processing liquid from the filter via a second liquid discharge pipe extending from the filter.

5. The substrate processing method according to claim 1, further comprising
a second circulation step of guiding, during the first rotation step, the processing liquid to a second circulation pipe branched from the first circulation pipe, while blocking a flow path of the first circulation pipe, wherein
the second circulation pipe extends from the first circulation pipe to a processing liquid storing section that stores the processing liquid therein.

* * * * *